United States Patent
Kinugasa et al.

(10) Patent No.: US 6,469,647 B1
(45) Date of Patent: Oct. 22, 2002

(54) HIGH-PRECISION D-A CONVERTER CIRCUIT

(75) Inventors: Norihide Kinugasa, Kyoto (JP); Kenichi Tatehara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/913,519

(22) PCT Filed: Jun. 14, 2000

(86) PCT No.: PCT/JP00/03883

§ 371 (c)(1),
(2), (4) Date: Aug. 15, 2001

(87) PCT Pub. No.: WO01/47123

PCT Pub. Date: Jun. 28, 2001

(30) Foreign Application Priority Data

Dec. 21, 1999 (JP) .......................................... 11-362747

(51) Int. Cl.[7] .................................................. H03M 1/66
(52) U.S. Cl. ..................................... 341/145; 341/144
(58) Field of Search ................................ 341/150, 145, 341/144, 154, 122

(56) References Cited

U.S. PATENT DOCUMENTS

| | | | |
|---|---|---|---|
| 4,338,591 A | 7/1982 | Tuthill | 341/144 |
| 4,491,825 A | 1/1985 | Tuthill | 341/144 |
| 5,252,975 A | * 10/1993 | Yuasa | 341/145 |
| 5,877,717 A | * 3/1999 | Tu et al. | 341/150 |
| 5,940,020 A | * 8/1999 | Ho | 341/145 |
| 6,246,351 B1 | * 6/2001 | Yilmaz | 341/145 |
| 6,268,817 B1 | * 7/2001 | Min et al. | 341/145 |
| 6,317,069 B1 | * 11/2001 | Male et al. | 341/154 |

FOREIGN PATENT DOCUMENTS

| | | | | |
|---|---|---|---|---|
| JP | 59-15325 | 1/1984 | .......... | H03M/1/178 |
| JP | 62-227224 | 10/1987 | .......... | H03M/1/68 |
| JP | 1-241220 | 9/1989 | .......... | H03M/1/68 |
| JP | 4-113672 | 4/1992 | .......... | H03M/1/68 |
| JP | 4-138725 | 5/1992 | .......... | H03M/1/78 |
| JP | 4-506289 | 10/1992 | .......... | H03M/1/78 |
| JP | 05-206858 | 8/1993 | .......... | H03M/1/68 |
| JP | 5-206863 | 8/1993 | .......... | H03M/1/78 |
| JP | 5-347562 | 12/1993 | .......... | H03M/1/78 |
| JP | 6-53835 | 2/1994 | .......... | H03M/1/78 |
| JP | 08-046515 | 2/1996 | .......... | H03M/1/78 |
| JP | 8-130477 | 9/1996 | .......... | H03M/1/68 |
| JP | 09-064744 | 3/1997 | .......... | H03M/1/68 |
| WO | WO 90-16114 | 12/1990 | .......... | H03M/1/78 |

OTHER PUBLICATIONS

International Search Report dated Sep. 26, 2000.

* cited by examiner

*Primary Examiner*—Peguy JeanPierre
(74) *Attorney, Agent, or Firm*—Nixon Peabody LLP; Donald R. Studebaker

(57) ABSTRACT

The digital-analog converter circuit includes: a high-order D-A converter circuit unit (100) for outputting a first voltage (Va) and a second voltage (Vb) both resulting from D-A conversion of the high-order five bits of a 13-bit input code to first and second output nodes (11, 12) through two buffers (10a, 10b) having the same characteristics, respectively; a low-order D-A converter circuit unit (200) for receiving the voltages on these two output nodes as reference voltages of an R-2R ladder circuit (201) and conducting D-A conversion of the low-order eight bits of the input code for output to a third output node (13); a sample-and-hold unit (250) for selectively sampling and holding the voltage on the third output node (13), i.e., the D-A conversion output of the 13-bit input code, according to a value of the input code; and an output unit (300) for multiplying the sampled and held D-A conversion output voltage by a gain with respect to an arbitrary central voltage. Thus, a D-A converter circuit capable of outputting a desired analog voltage with high accuracy even when a large number of bits are converted is implemented with a small chip area.

12 Claims, 23 Drawing Sheets

1101 ···· INITIAL RESET CANCEL
         SIGNAL PRODUCING UNIT
1102 ···· POWER-ON DETECTING UNIT

HIGH-PRECISION D-A CONVERTER CIRCUIT

TECHNICAL FIELD

The present invention relates to a digital-analog (D-A) converter circuit formed in a semiconductor integrated circuit, and more particularly, relates to a composite D-A converter circuit including a resistance string D-A converter circuit unit and an R–2R ladder resistance D-A converter circuit unit.

BACKGROUND ART

The documents of the related art disclosing a conventional D-A converter circuit include Japanese Laid-Open Publication Nos. 62-227224 (Laid-Open Publication Date: Oct. 6, 1987), 5-206858 (Laid-Open Publication Date: Aug. 13, 1993), 8-46515 (Laid-Open Publication Date: Feb. 16, 1996) and 9-64744 (Laid-Open Publication Date: Mar. 7, 1997), and U.S. Pat. No. 4,338,591 (Issue Date: Jul. 6, 1982) and U.S. Pat. No. 4,491,825 (Issue Date: Jan. 1, 1985).

A D-A converter circuit is generally used to convert a digital input code to an analog quantity. The D-A converter circuits for integration primarily include a resistance string D-A converter circuit and an R–2R ladder resistance DA converter circuit. The resistance string D-A converter circuit is advantageous in terms of monotonicity, but the use of the resistance string D-A converter circuit is difficult from the standpoint of the pattern area and conversion accuracy when a digital input code has a large number of bits n. On the other hand, the use of the R–2R ladder resistance D-A converter circuit is difficult from the standpoint of the monotonicity and pattern area when a digital input code has a large number of bits n.

For example, in applications of the D-A converter circuit to a tester for testing another semiconductor device, there are strong requirements for the D-A converter circuit, including not only high conversion accuracy but also minimized pattern area for a single D-A converter circuit since a plurality of D-A converter circuits are integrated. Recently, multi-bit D-A conversion for converting a large number of bits is also strongly required. Any type of D-A converter circuit is effective in converting a small number of bits. However, difficulty in realizing high-precision conversion and increase in pattern area are problematic to configure a D-A converter circuit for converting a large number of bits.

As described above, it has been difficult to use the conventional resistance string or R–2R ladder resistance D-A converter circuit to convert a large number of bits.

DISCLOSURE OF THE INVENTION

It is an object of the present invention to provide a D-A converter circuit capable of accurately outputting, even when converting a large number of bits, a desired analog voltage without requiring device accuracy, and also capable of being integrated with a small pattern area.

In order to achieve this object, the D-A converter circuit of the present invention includes: a high-order D-A converter circuit unit for: receiving a high-order i bit signal (i<n) of an n-bit digital input code, and outputting first and second voltages resulting from D-A conversion of the high-order i bit signal to first and second output nodes through first and second buffers, respectively; a low-order D-A converter circuit unit for receiving the first and second output node voltages of the high-order D-A converter circuit unit as reference voltages of an R–2R ladder circuit, and conducting D-A conversion of remaining low-order j bits (j<n, j=n−i) of the n-bit digital input code for output to a third output node; a sample-and-hold unit for selectively sampling and holding the voltage on the third output node, i.e., the D-A conversion output of the n-bit digital input code, according to a value of the n-bit digital input code; and an output unit for multiplying the sampled and held D-A conversion output voltage by a gain with respect to an arbitrary central voltage.

BRIEF DESCRIPTION OF THE DRAWINGS

FIG. 4 is a diagram showing the structure of a simultaneous ON prevention circuit for preventing a plurality of non-adjacent MOS switches in a high-order D-A converter circuit unit of FIG. 1 from being simultaneously turned ON;

BEST MODE FOR CARRYING OUT THE INVENTION

Hereinafter, embodiments of the present invention will be described in detail with reference to the accompanying drawings.

Figure 1:
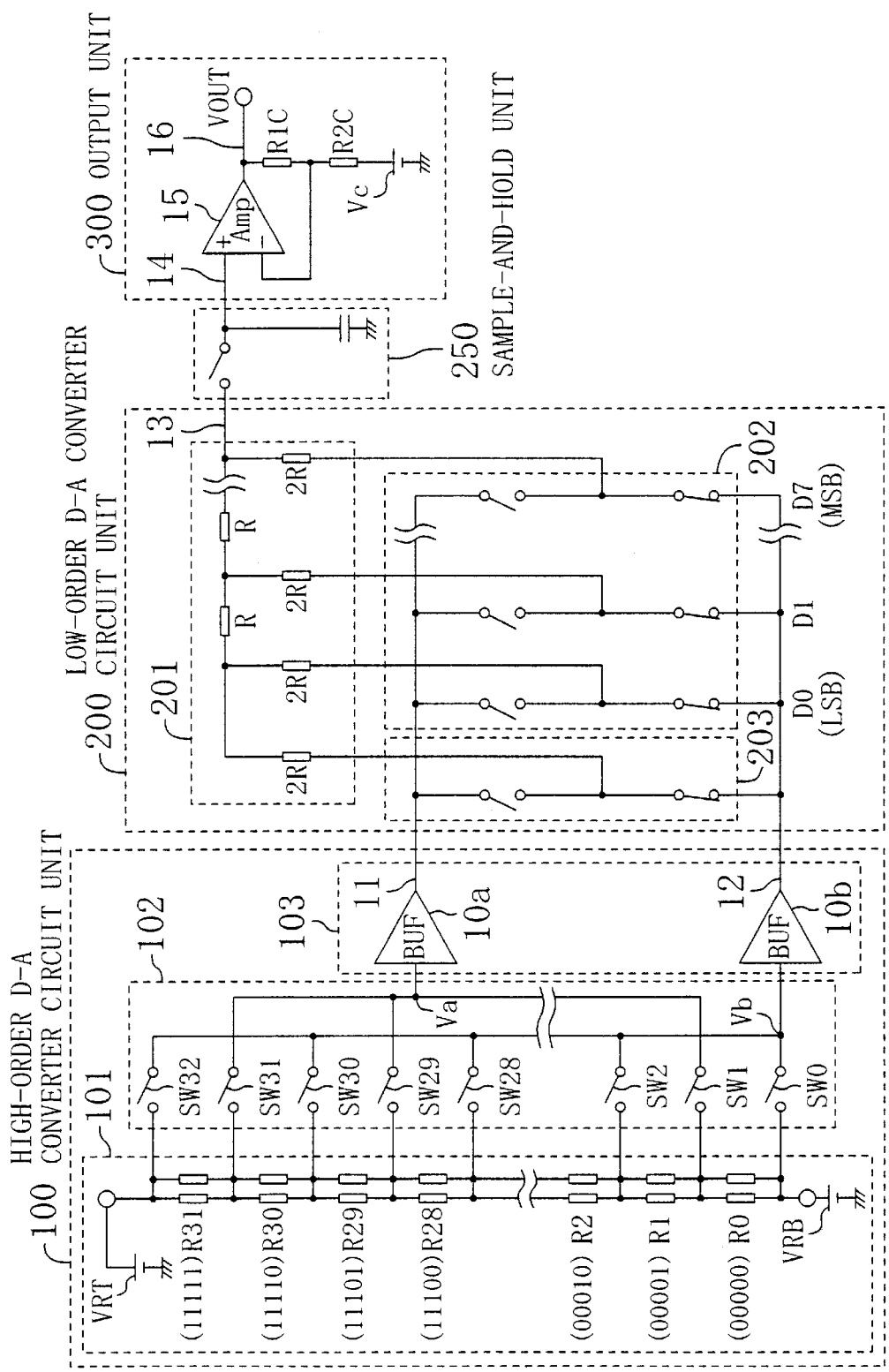
FIG. 1 is a block diagram showing the basic structure of a composite D-A converter circuit according to an embodiment of the present invention.

FIG. 1 is a block diagram showing the basic structure of a composite D-A converter circuit according to an embodiment of the present invention. The D-A converter circuit of FIG. 1 conducts D-A conversion of an n-bit (n=13 in this example) digital input code to produce an output voltage VOUT, and includes a high-order D-A converter circuit unit 100, a low-order D-A converter circuit unit 200, a sample-and-hold unit 250, and an output unit 300.

The high-order D-A converter circuit unit 100 receives the high-order i bits (1·i<n; i=5 in this example) of the digital input code, conducts D-A conversion thereof, and outputs first and second D-A conversion voltages respectively to first and second output nodes 11, 12 simultaneously. The high-order D-A converter circuit unit 100 includes: a resistance string unit 101 having $2^i$ resistive elements R0 to R31 with the same resistance value connected in series between applied first and second reference voltages VRT, VRB, for equally dividing the voltage difference between the first and second reference voltages VRT, VRB by each resistive element; a selection circuit unit 102 having ($2^i$+1) MOS switches SW0 to SW32 for selecting a voltage on an adjacent one of the connection nodes of the resistance string unit 101; and a buffer unit 103 having two buffers 10a, 10b for receiving connection node voltages va, vb selected by the selection circuit unit 102 and outputting the same to the first and second output nodes 11, 12, respectively. Accordingly, each of the voltages output to the first and second output nodes 11, 12 is a voltage at both ends of any string resistance of the resistance string unit 101, whereby the minimally divided voltage difference (in FIG. 1, (VRT−VRB)/$2^5$) is obtained.

The low-order D-A converter circuit unit 200 conducts D-A conversion of the remaining j bits (j=n−i; j=8 in this example) of the n-bit digital input code based on the voltages output from the high-order D-A converter circuit unit 100 to the first and second output nodes 11, 12 (hereinafter, referred to as low-order reference voltages), and includes an R−2R ladder resistance unit 201, a MOS switch unit 202 for transmitting the low-order reference voltages to the R−2R ladder resistance unit 201 according to a digital value of the low-order j-bit input, and a low-order reference voltage switching unit 203 for setting one of the low-order reference voltages as a lower-potential reference voltage and the other as a higher-potential reference voltage. At an output terminal 13 of the low-order D-A converter circuit 200 having such a structure, a D-A conversion output voltage of the low-order j bits is obtained based on the low-order reference voltages. This output voltage value is a D-A conversion value of the n-bit (n=13 in this example) digital input code based on the difference between the first and second reference voltages VRT, VRB applied to the high-order D-A converter circuit unit 100.

The D-A conversion output voltage at the output terminal 13 of the low-order D-A converter circuit unit 200 is connected to an input terminal 14 of an operational amplifier 15 of the output unit 300 through the sample-and-hold unit 250 that selectively operates with a prescribed digital input code. The output voltage VOUT from the output unit 300 is output to an n-bit D-A conversion output terminal 16. R1c and R2c are feedback resistances, and Vc is an arbitrary central voltage.

Figure 2:
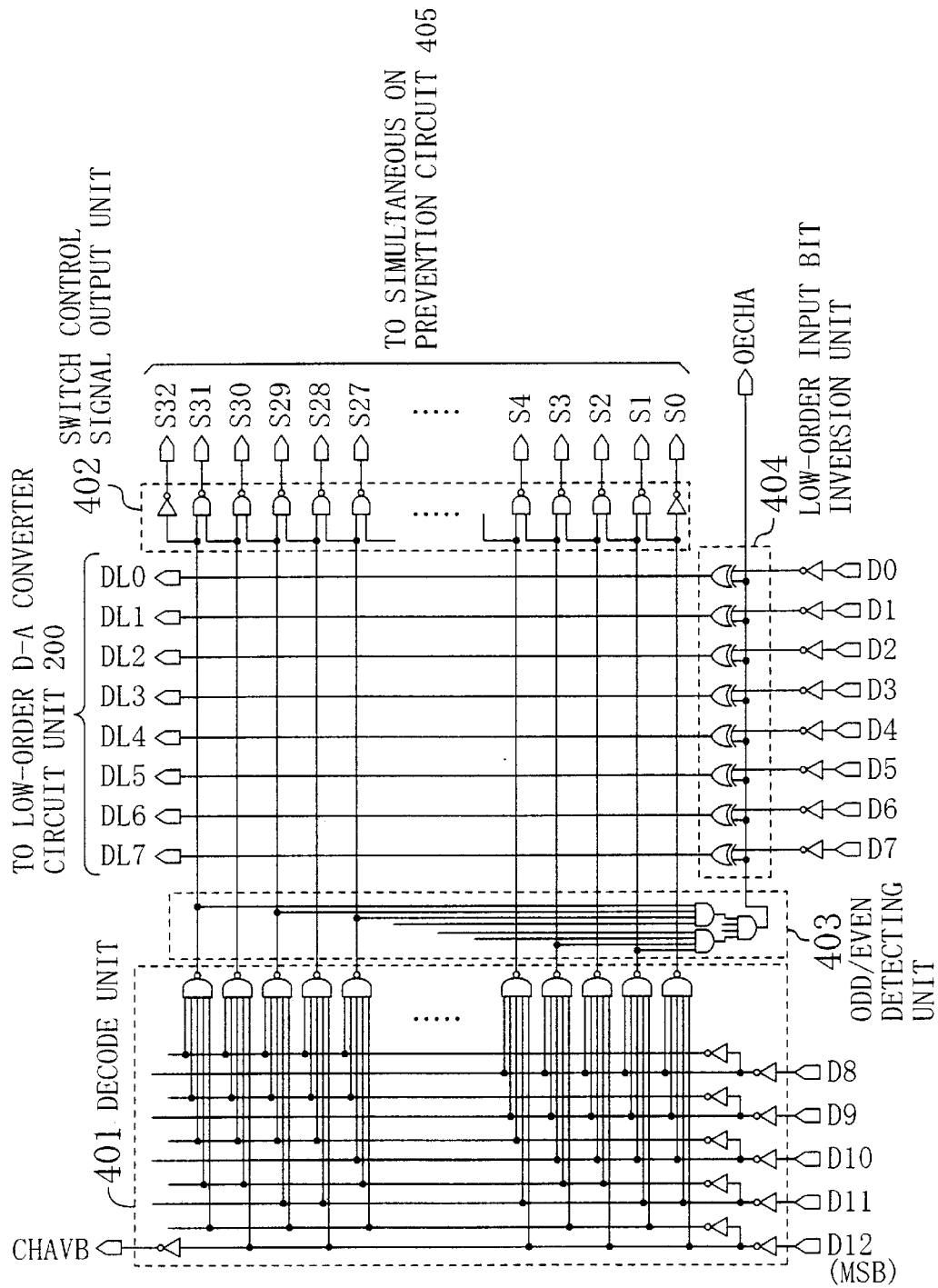
FIG. 2 is a diagram showing the circuit structure of a control unit of the D-A converter circuit of FIG. 1.

FIG. 2 is a diagram showing the circuit structure of a control unit in the selection circuit unit 102 of the high-order D-A converter circuit unit 100. The control unit includes: a decoding unit 401 for decoding the high-order i bits of the n-bit digital input code in $2^i$ ways to produce a decode signal for turning ON/OFF the MOS switches (SW0 to SW32) in the selection circuit unit 102; a switch control signal output unit 402 for outputting a switch control (S0 to S32) signal for turning ON adjacent two of the MOS switches (SW0 to SW32) according to the decode result of the decode unit 401; an odd/even detecting unit 403 for detecting, based on the high-order i bits of the digital input code, whether a selected one of the voltage segments divided in the resistance string unit 401 is an odd or even voltage segment; and a low-order input bit inversion unit 404 for inverting the low-order j bits of the digital input code according to an odd/even detection signal (OECHA) obtained in the odd/even detecting unit 403 and transmitting the inverted bits to the low-order D-A converter circuit unit 200.

Figure 3:
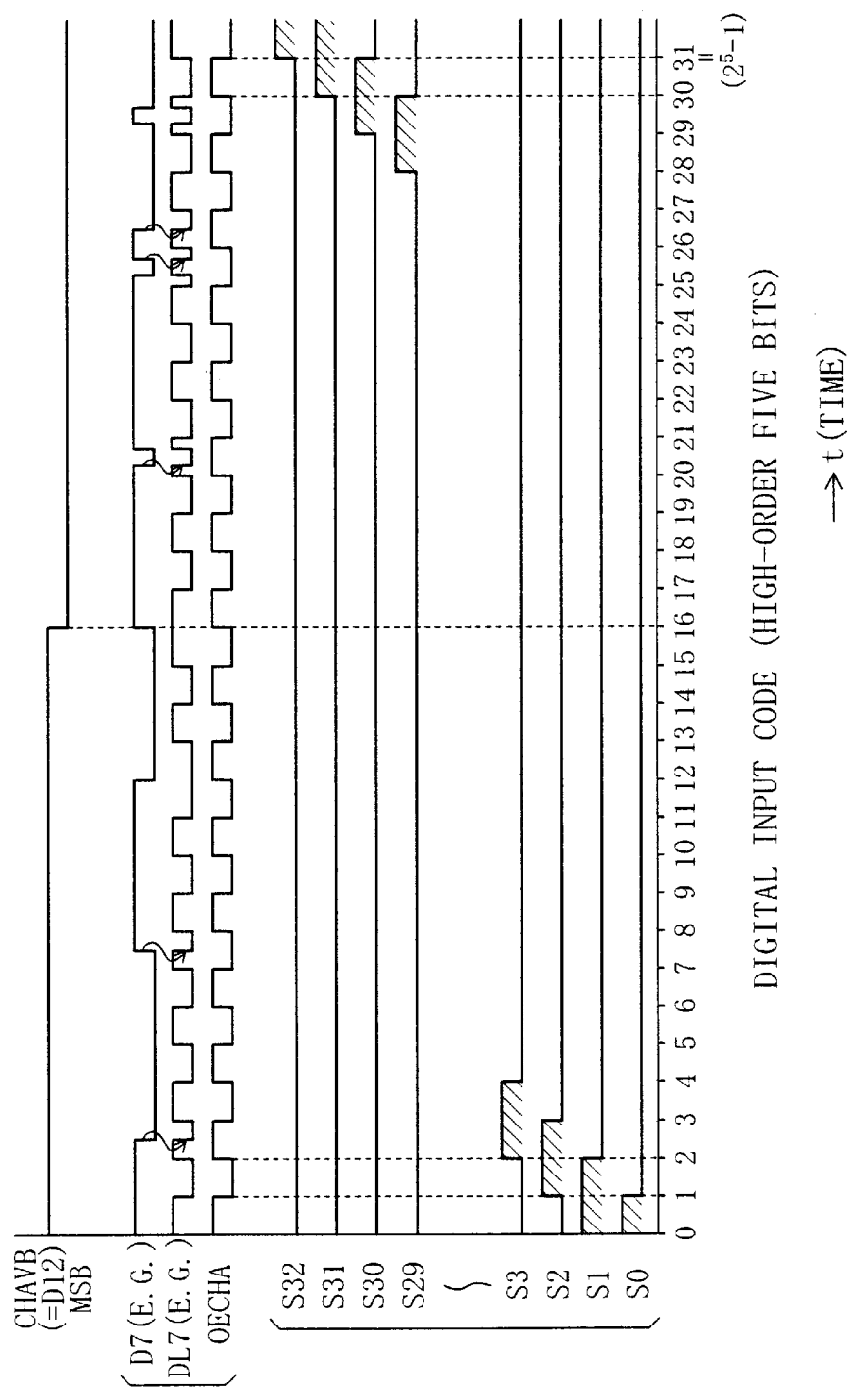
FIG. 3 is an operating waveform chart of a main part of the control unit of FIG. 2.

The respective outputs of the switch control signal output unit 402 and the odd/even detecting unit 403 are readily obtained from the output of the decode unit 401. In the decode unit 401, binary values of the high-order i bits of the digital input code are applied to 32 5-input NAND gates, so that the output of the decode unit 401 can be obtained from the outputs of the 5-input NAND gates. The reason why the low-order j bits of the digital input code are inverted in the low-order input bit inversion unit 404 is that the respective levels of the voltages output to the first and second output nodes 11, 12 are switched with respect to each other depending on whether a selected one of the voltage segments divided in the resistance string unit 101 is an odd voltage segment or an even voltage segment. When an odd voltage segment from the lower potential side (the first or second reference voltage) is selected by adjacent two MOS switches, the voltage value output to the first output node 11 is higher in potential than the voltage value output to the second output node 12. When an even voltage segment is selected, however, the voltage value output to the first output node 11 is lower in potential than the voltage value output to the second output node 12. Thus, the respective levels of the reference voltages for the low-order D-A converter circuit unit 200 are switched with respect to each other according to the digital input code. operating waveforms of a main part of the control unit are shown in FIG. 3. FIG. 3 shows a timing chart of each element when the high-order i bits (i=5 in this example) of the n-bit (n=13 in this example) digital input code change from 0 to 31 (=$2^5$−1) in decimal notation. As the high-order i bits change, the outputs (S0 to S32) of the switch control signal output unit 402 sequentially appear with overlap of half period as shown in FIG. 3. The odd/even detection signal (OECHA) is output with its output level (Hi/Lo) being switched every time the high-order i bits are incremented. For example, D7 (low-order MSB) of the low-order j bits (j=8 in this example) is inverted in the "Lo" period (or the "Hi" period depending on a circuit) of the odd/even detection signal (OECHA) as shown in FIG. 3, and transmitted to the low-order D-A conversion output unit 200. A signal CHAVB in FIG. 3 corresponds to D12 (MSB) output only through two inverters.

Figure 4:
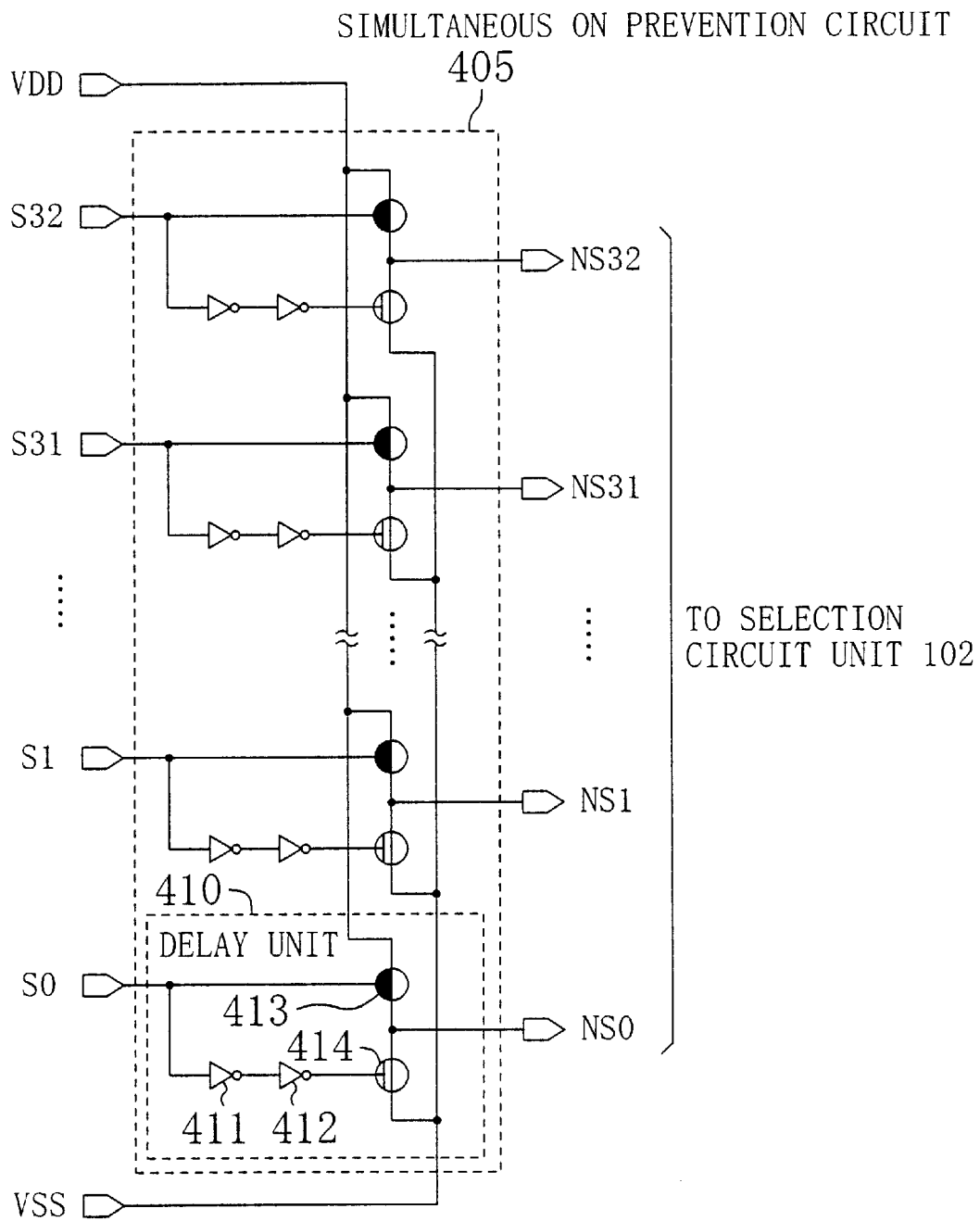

FIG. 4 is a diagram showing the structure of a simultaneous ON prevention circuit, i.e., a means for preventing an output signal transmitted from the switch control signal output unit 402 to the MOS switches (SW0 to SW32) from simultaneously turning ON a plurality of nonadjacent MOS switches among the MOS switches (SW0 to SW32). The simultaneous ON prevention circuit 405 includes delay units 410, each of which includes a p-channel MOS transistor 413 for receiving an output signal, e.g., S0, directly from the switch control signal output unit 402, and an n-channel MOS transistor 414 for receiving the output signal from the switch control signal output unit 402 through inverters 411, 412, and having its drain connected to the drain of the p-channel MOS transistor 413. In the simultaneous ON prevention circuit 405 having such a structure, the p-channel MOS transistor 413 is turned ON earlier than the n-channel MOS transistor 414 in response to the input signal (S0 to S32). Therefore, every output signal (NS0 to NS32) of the simultaneous ON prevention circuit 405 is once rises to "Hi".

Then, only the selected adjacent output signals transition to active "Lo". Thus, a plurality of non-adjacent MOS switches can be prevented from being simultaneously turned ON.

Figure 5:
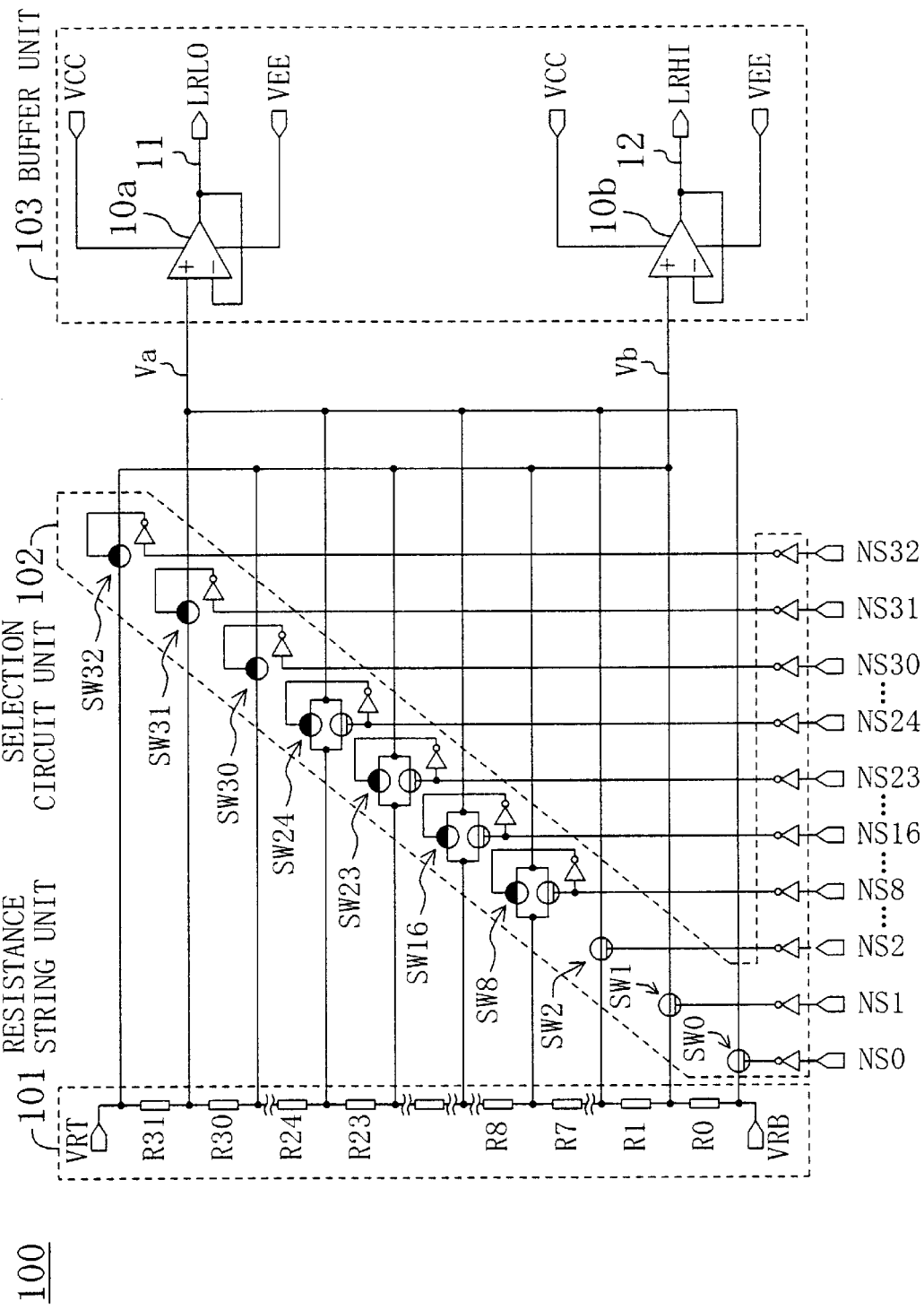
FIG. 5 is a diagram specifically showing the circuit structure of the high-order D-A converter circuit unit of FIG. 1.

FIG. 5 is a diagram specifically showing the circuit structure of the MOS switches (SW0 to SW32) of the selection circuit unit 102 in the high-order D-A converter circuit unit 100. In FIG. 5, the MOS switches SW0, SW1, SW2 respectively connected to the string resistance connection nodes near the VRB end of the resistance string unit 101 are each formed only from an n-channel MOS transistor. The MOS switches SW30, SW31, SW32 respectively connected to the string resistance connection nodes near the VRT end of the resistance string unit 101 are each formed only from a p-channel MOS transistor.

The other MOS switches SW3 to SW29 have a CMOS structure. In other words, each of the MOS switches respectively connected to the string resistance connection nodes near both ends of the resistance string unit 101 is formed only from an n-channel or p-channel MOS transistor. However, the same CMOS switch as that for the other connection nodes may alternatively be used. It should be noted that the n-channel and p-channel MOS transistors of the MOS switches (SW0 to SW32) have the same size. The buffer unit 103 of the high-order D-A converter circuit unit 100 structured as shown in FIG. 5 includes two buffers 10a, 10b having the same characteristics. The first buffer 10a having its output terminal connected to the first output node 11 and the second buffer 10b having its output terminal connected to the second output node 12 have their respective input terminals connected to the corresponding connection nodes of the resistance string unit 101 through the corresponding MOS switches (SW1 to SW32). Each of the first and second buffers 10a, 10b is fixedly connected to the corresponding connection nodes of the resistance string unit 101. Therefore, when adjacent two of the MOS switches (SW0 to SW32) are sequentially selected from SW0 to SW32, the minimally divided voltages of the resistance string unit 101 are respectively output to the first and second output nodes 11, 12, i.e., first and second buffer output terminals, with their respective levels (a Hi voltage and a Lo voltage) being alternately switched with respect to each other. The minimally divided voltages are thus transmitted as reference voltages of the low-order D-A converter circuit unit 200.

Figure 6:
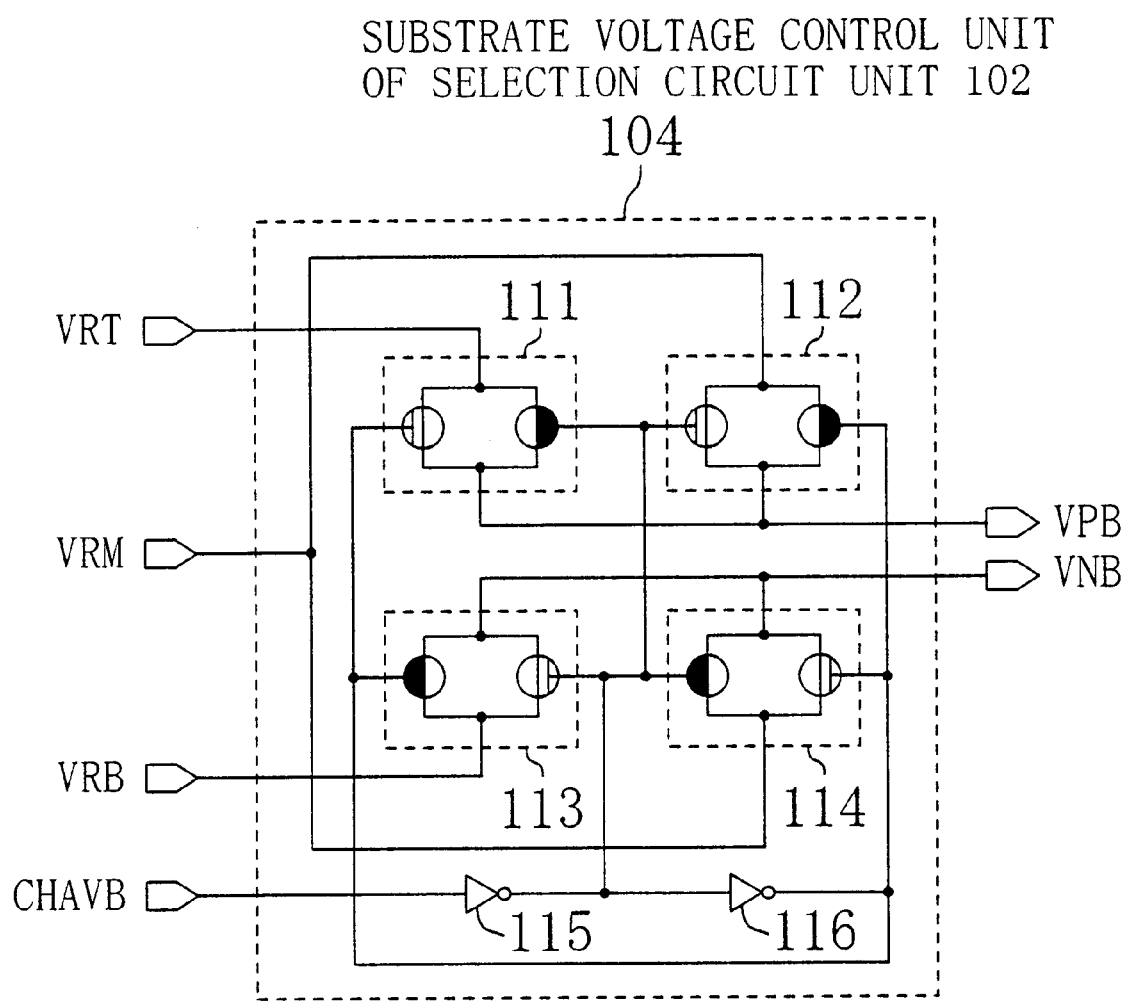
FIG. 6 is a diagram showing the structure of a circuit for controlling a substrate voltage of each MOS switch in the high-order D-A converter circuit unit of FIG. 1.

FIG. 6 is a diagram showing the circuit structure of a substrate voltage control unit 104 for the n-channel and p-channel MOS transistors, i.e.., the MOS switches (SW0 to SW32), of the selection circuit unit 102 in the high-order D-A converter circuit unit 100. The substrate voltage control unit 104 includes MOS switches 111, 112, 113, 114 having the same size and characteristics and inverters 115, 116. The MOS switches 111, 113 respectively receive the first and second reference voltages VRT, VRB, and the MOS switches 112, 114 receive the median voltage (hereinafter, simply referred to as "VRM") of the difference between the first and second reference voltages, i.e., the divided median voltage of the resistance string unit 101 (the voltage at the connection between R15 and R16). The MOS switches 111, 112, 113, 114 are turned ON/OFF with a signal (CHAVB) corresponding to the MSB of the 13-bit digital input code. The MOS switches 111, 112 have their respective output terminals connected together (VPB) so as to be connected to the substrate of the p-channel MOS transistors of SW0 to SW16 of the MOS switches (SW0 to SW32). The MOS switches. 113, 114 have their respective output terminals connected together (VNB) so as to be connected to the substrate of the n-channel MOS transistors of SW17 to SW32 of the MOS switches (SW0 to SW32). The n-channel MOS transistor substrate of SW0 to SW16 of the MOS switches (SW0 to SW32) is connected to VRB, whereas the p-channel MOS transistor substrate of SW17 to SW32 of the MOS output nodes 11, 12. Although VRT, VRM and VRB are herein applied to the substrate voltage control unit 104, buffered VRT, VRM and VRB may alternatively be applied thereto. operating waveforms of a main part of the high-order D-A converter circuit unit 100 in FIG. 1 are shown in FIG. 7.

Figure 7:
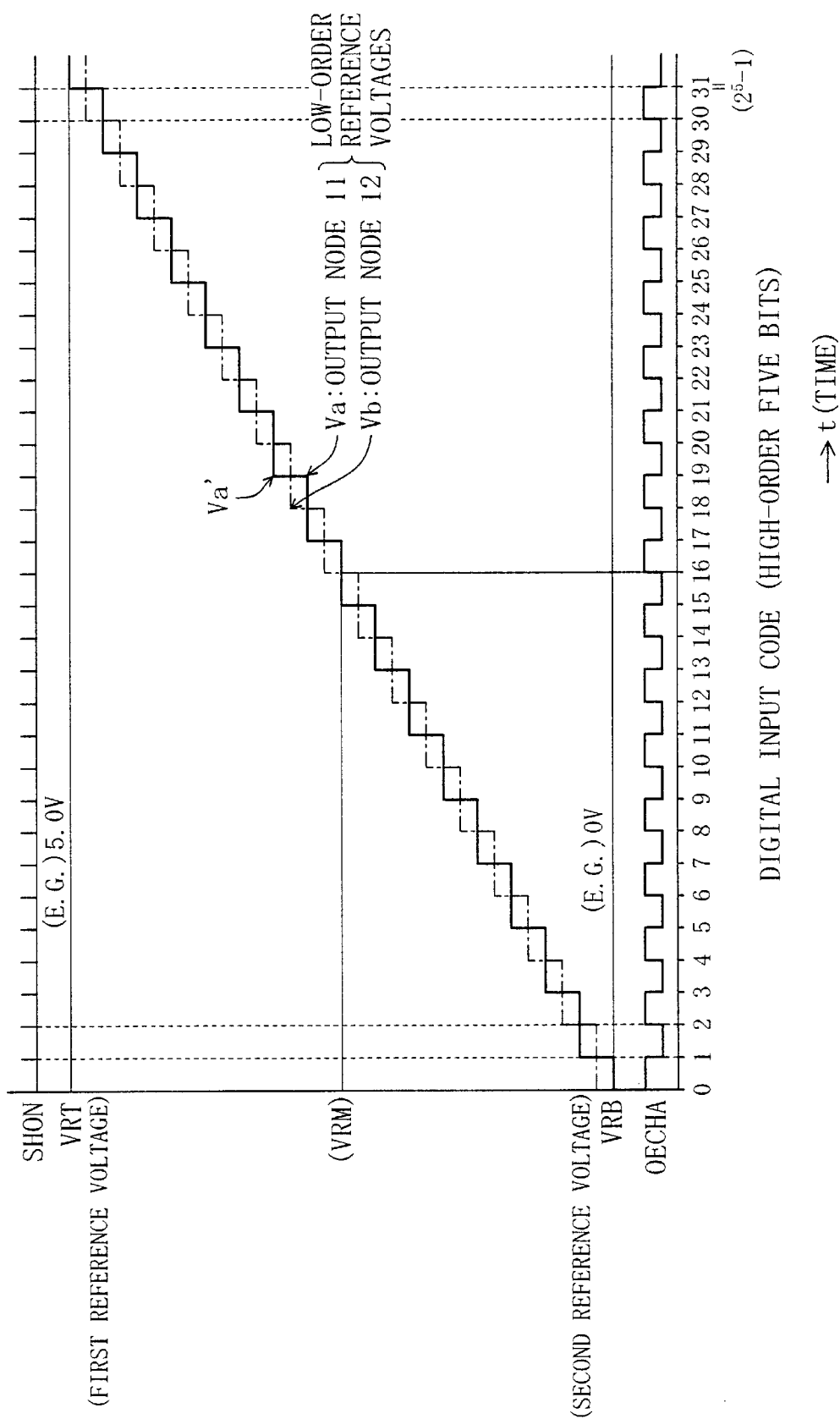
FIG. 7 is an operating waveform chart of a main part of the high-order D-A converter circuit unit of FIG. 1.

FIG. 7 shows variation in voltage Va, Vb of the first and second output nodes 11, 12 when the high-order i bits (i=5 in this example) of the n-bit (n=13 in this example) digital input code change from 0 to 31 (=25−1) in decimal notation. With every change (increment) of the high-order i bits, the voltages Va, Vb in the range of VRB to VRT are respectively output to the first and second output nodes 11, 12 according to the output signal (S0 to S32) of the switch control signal output unit 402, with the respective levels of the voltages Va, Vb being alternately switched with respect to each other.

Figure 8:
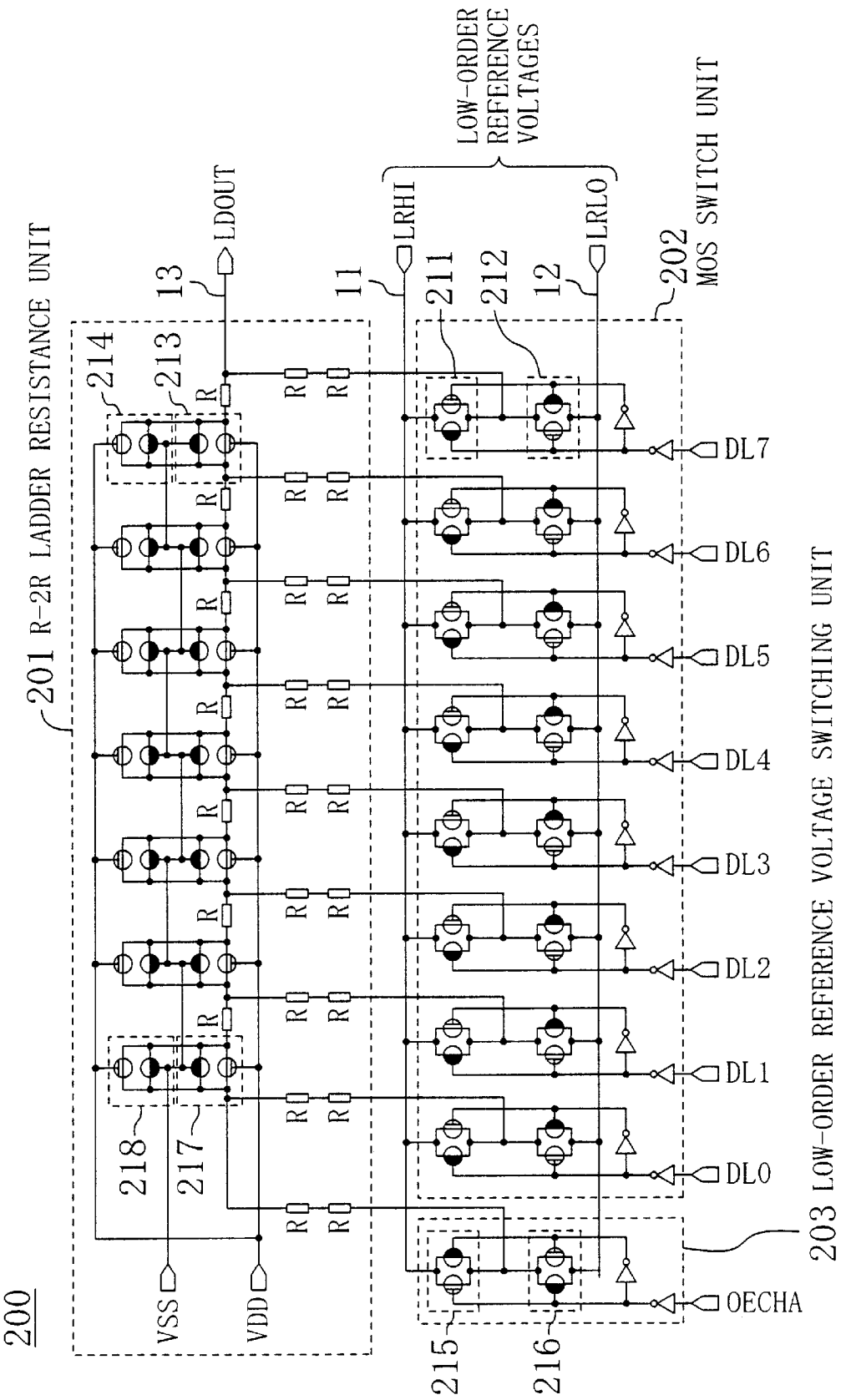
FIG. 8 is a diagram showing the circuit structure of a low-order D-A converter circuit unit of FIG. 1.

FIG. 8 is a diagram showing the circuit structure of the low-order D-A converter circuit unit 200. The low-order D-A converter circuit unit 200 includes: an R–2R ladder resistance unit 201; a MOS switch unit 202 for switching the input to the ladder resistance unit 201 between the voltage (LRHI) output to the first input node 11 and the voltage (LRLO) output to the second output node 12 according to the value of the low-order j bits of the digital input code, and a low-order reference voltage switching unit 203 for setting switches (SW0 to SW32) is connected to VRT. In other words, regarding SW0 to SW16 of the MOS switches (SW0 to SW32) the n-channel MOS transistor substrate voltage is fixed to VRB, and the p-channel MOS transistor substrate voltage is switched between VRM and VRT according to the signal CHAVB.

Regarding SW17 to SW32, the p-channel MOS transistor substrate voltage is fixed to VRB, and the n-channel MOS transistor substrate voltage is switched between VRB and VRM according to the signal CHAVB. This enables the substrate-source voltage of each of the n-channel and p-channel MOS transistors of the MOS switches (SW0 to SW32) to be minimized (at most VRT−VRM, or VRM−VRB). In other words, an ON-resistance value can be reduced without increasing the size (gate width W) of the MOS transistor, enabling reduction in settling time of the low-order reference voltages. Moreover, variation in substrate-source voltage of each of the n-channel and p-channel MOS transistors according to the connection node voltage of the string resistance connected thereto is reduced by half. Therefore, variation in ON-resistance value can also be reduced. The MOS switches (SW0 to SW32) having their substrate voltages thus controlled are used in the selection circuit unit 102 of the high-order D-A converter circuit unit 100, whereby voltages on adjacent connection nodes among those of the resistance string can be accurately output at a high speed to the first and second one of the low-order reference voltages as a lower-potential reference voltage and the other as a higher-potential reference voltage according to the odd/even detection signal (OECHA). A D-A conversion output LDOUT of the low-order D-A converter circuit unit 200 is output to the output terminal 13.

In the low-order D-A converter circuit unit 200 having such a structure, pairs of MOS switches 213, 214; 217, 218 are inserted in the ON state:on the R side of the R–2R ladder resistance unit 201 such that the MOS switches of each pair are connected in parallel with each other. The MOS switches 213, 214; 217, 218 are the same as the MOS switches 211, 212 of the MOS switch unit 202 having the same size and characteristics. Thus, the ON resistance of the inserted MOS switches cancels the ON resistance value of each MOS switch 211, 212 of the MOS switch unit 202 during resistance composition of R–2R. Accordingly, accuracy in D-A conversion output LDOUT to the third output node 13 can be improved. In the figure, 215 and 216 indicate two MOS switches in the low-order reference voltage switching unit 203. With the respective levels of the low-order reference voltages being switched with respect to each other, the low-order reference voltage switching unit 203 switches the low-order reference voltages according to the odd/even detection signal (OECHA) for input to the other end of 2R that is combined with another 2R of the R–2R ladder resistance unit 201 which receives a voltage switched according to the LSB value of the low-order j bits. The low-order j bits applied to the MOS switch unit 202 have been inverted in the low-order input bit inversion unit 404, because the respective levels of the low-order reference voltages are switched with respect to each other depending on whether a selected one of the voltage segments divided in the resistance string unit 101 is an odd voltage segment or an even voltage segment. This enables the low-order reference voltages to be used as the reference voltages for the low-order D-A converter circuit unit 200 even if their respective levels are switched with respect to each other according to the digital input code. The resistance 2R of the R–2R ladder resistance unit 201 is formed from series-connected two resistance elements, which are the same as those used in the R portion. Thus, the accuracy in resistance ratio is improved.

Figure 9:
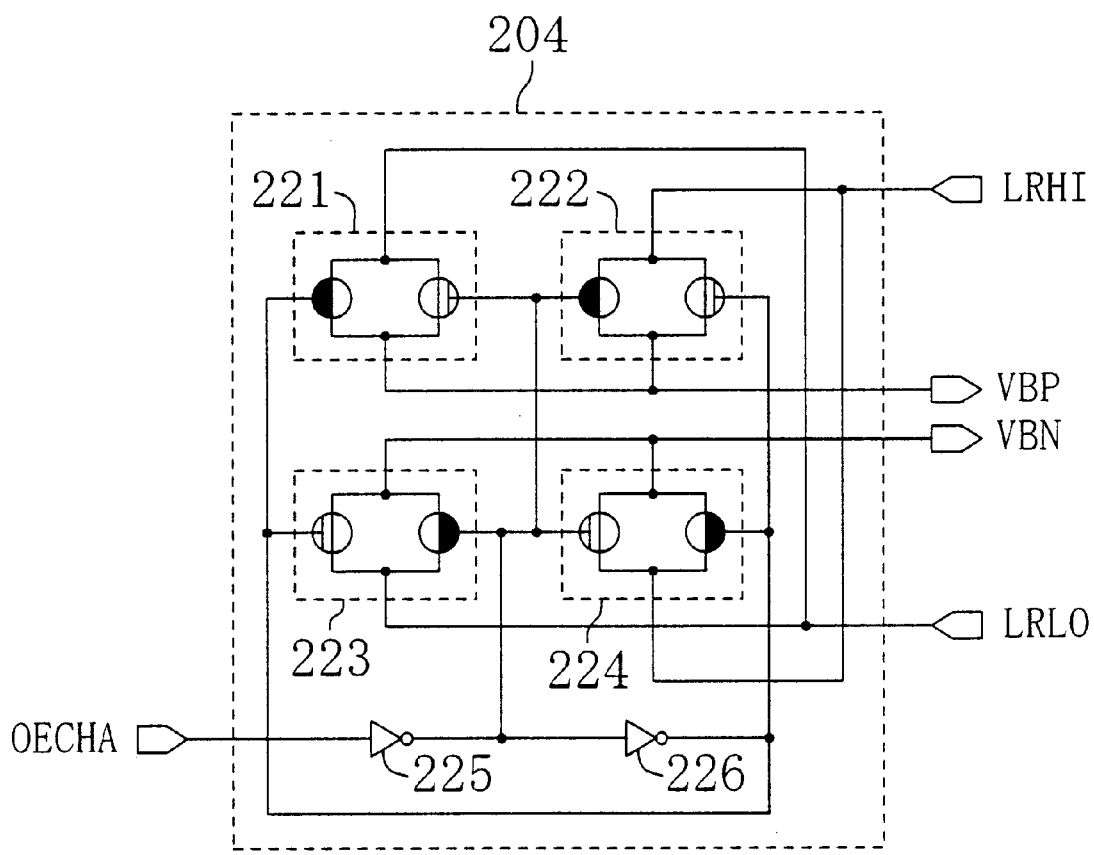
FIG. 9 is a diagram showing the structure of a circuit or controlling a substrate voltage of each MOS switch in the low-order D-A converter circuit unit of FIG. 1.

FIG. 9 is a diagram showing the circuit structure of a substrate voltage control unit 204. The substrate voltage control unit 204 controls a substrate voltage to be applied to the n-channel and p-channel MOS transistors of each MOS switch 213, 214; 217, 218 in the R–2R ladder resistance unit 201 of the low-order D-A converter circuit unit 200, each MOS switch 211, 212 in the MOS switch unit 202 for switching the voltage to be transmitted to the ladder resistance unit 201 between LRHI and LRLO according to the value of the low-order j bits, and each MOS switch 215, 216 of the low-order reference voltage switching unit 203. The substrate voltage control unit 204 includes MOS switches 221, 222, 223, 224 having the same size and characteristics, and inverters 225, 226. The MOS switches 221, 223 receiving one of the low-order reference voltages (LRLO in FIG. 9) and the MOS switches 222, 224 receiving the other (LRHI in FIG. 9) are turned ON/OFF with the odd/even detection signal (OECHA). The MOS switches 221, 222 have their respective output terminals connected together (VBP), and the MOS switches 223, 224 have their respective output terminals connected together (VBN). Thus, the MOS switches 221, 222 are connected to the substrate of the p-channel MOS transistors of the MOS switches 213, 214; 217, 218 inserted in series between the resistances R of the R–2R ladder resistance unit 201, the MOS switches 211, 212 of the MOS switch unit 202, and the MOS switches 215, 216 of the low-order reference voltage switching unit 203, whereas the MOS switches 223, 224 are connected to the substrate of the n-channel MOS transistors thereof. The substrate voltage control unit 204 having such a structure applies the higher-potential voltage of the low-order reference voltages to the substrate of the p-channel MOS transistors, and applies the lower-potential voltage thereof to the substrate of the n-channel MOS transistors. This enables the substrate-source voltage of each of the n-channel and p-channel MOS transistors of the MOS switches 211 to 218 of the R–2R ladder resistance unit 201, MOS switch unit 202 and low-order reference voltage switching unit 203 to be minimized (at most $(VRT-VRB)/2^i$). In other words, the ON-resistance value can be reduced without increasing the size (gate width W) of the MOS transistor, and variation in ON-resistance value is also reduced. Accordingly, accuracy in D-A conversion output from the low-order D-A converter circuit unit 200 to the third output node 13 can be improved.

Figure 10:
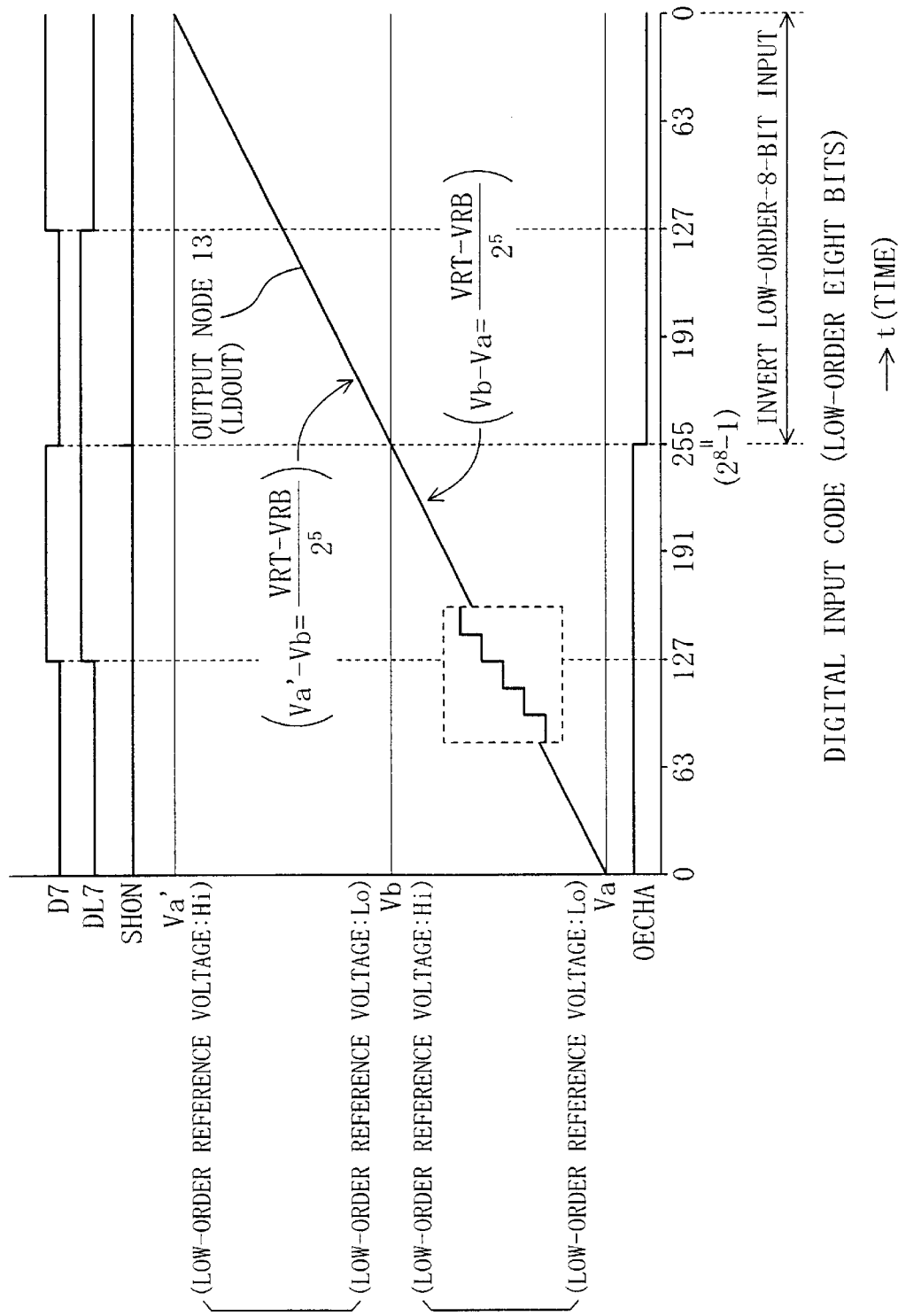
FIG. 10 is an operating waveform chart of a main part of the low-order D-A converter circuit unit of FIG. 1.

Operating waveforms of a main part of the low-order D-A converter circuit unit 200 in FIG. 1 are shown in FIG. 10. FIG. 10 shows a timing chart of each element when the low-order j bits (j=8 in this example) of the n-bit (n=13 in this example) digital input code change twice from 0 to 255 (=28–1) in decimal notation. Variation in third output node voltage (LDOUT) with a change in low-order j bits is shown. In FIG. 10, the higher-potential voltage of the low-order reference voltages is Vb and the lower-potential voltage thereof is Va in the first change (first half) from 0 to 255 (=28–1) in decimal notation. In the second change (latter half), however, the higher-potential voltage of the low-order reference voltages is Va' and the lower-potential voltage thereof is vb, i.e., the higher-potential voltage in the first change. This voltage relation can be given by the following equation: $Va+-Vb=Vb-Va=(VRT-VRB)/2^5$. In FIG. 10, the odd/even detection signal (OECHA) goes to "Lo" in the second change (latter half) after the low-order j bits change from 0 to 255 (=$2^8$–1) in decimal notation. Therefore, every bit of the low-order j bits of the digital input code is inverted for input to the low-order D-A converter circuit unit 200. Accordingly, even if the respective levels of the low-order reference voltages are switched with respect to each other according to a change in odd/even detection signal (OECHA), the low-order D-A conversion output to the third node 13 is continuously output as shown in FIG. 10. For example, D7 (low-order MSB) of the low-order j bits is inverted in the "Lo" period (or the "Hi" period depending on a circuit) of the odd/even detection signal (OECHA). Therefore, the resultant output waveform is as shown by DL7 in FIG. 10.

Figure 11:
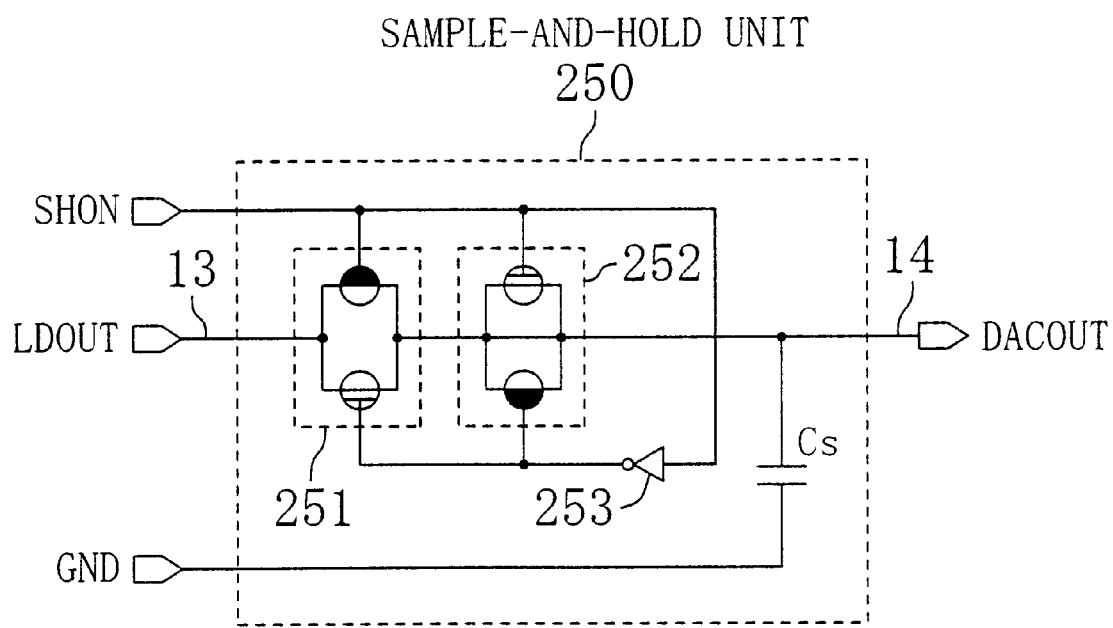
FIG. 11 is a diagram showing the circuit structure of a sample-and-hold unit of FIG. 1.

FIG. 11 is a diagram showing the circuit structure of the sample-and-hold unit 250 for selectively sampling and holding the voltage LDOUT on the third output node 13, i.e., the D-A conversion output of the low-order D-A converter circuit unit 200, according to the value of the digital input code. The sample-and-hold unit 250 includes a hold capacitance Cs, a MOS switch 251 receiving the voltage on the third output node 13, a feed-through MOS switch (with its input and output being short-circuited with wiring) 252 receiving the output of the MOS switch 251 and having its output terminal connected to the end of the hold capacitance Cs other than the grounded end thereof, and an inverter 253. When a sample-and-hold signal (SHON) is at "Hi" level, the voltage of the hold capacitance Cs is held and output to an output terminal (DACOUT in FIG. 11) 14 of the sample-and-hold unit 250. On the other hand, when the sample-and-hold signal (SHON) is at "Lo" level, the voltage on the third output node 13, i.e., the D-A conversion output of the low-order D-A converter unit 200 (the D-A conversion output of the n-bit digital input code), is output to the output terminal 14 of the sample-and-hold unit 250. As described below, the sample-and-hold signal (SHON) applied to such a sample-and-hold unit 250 is produced both at the rise and fall of the odd/even detection signal (OECHA) according to the value of the input digital code. Therefore, during transition of the digital input code such as when the respective levels of the low-order reference voltages are switched with respect to each other, the D-A conversion output of the previous digital input code, i.e., the output voltage on the third output node 13, is reliably held for a prescribed time. Then, the D-A conversion output of the following digital input code can be output to the output terminal 14 of the sample-and-hold unit 250 after the respective results of switching of the respective levels of the low-order reference voltages with respect to each other, detection in the odd/even detecting unit 403, and inversion of the low-order input bit inversion unit 404 are sufficiently settled. This avoids glitches that are likely to occur during transition of the digital input code as described above.

Figure 12:
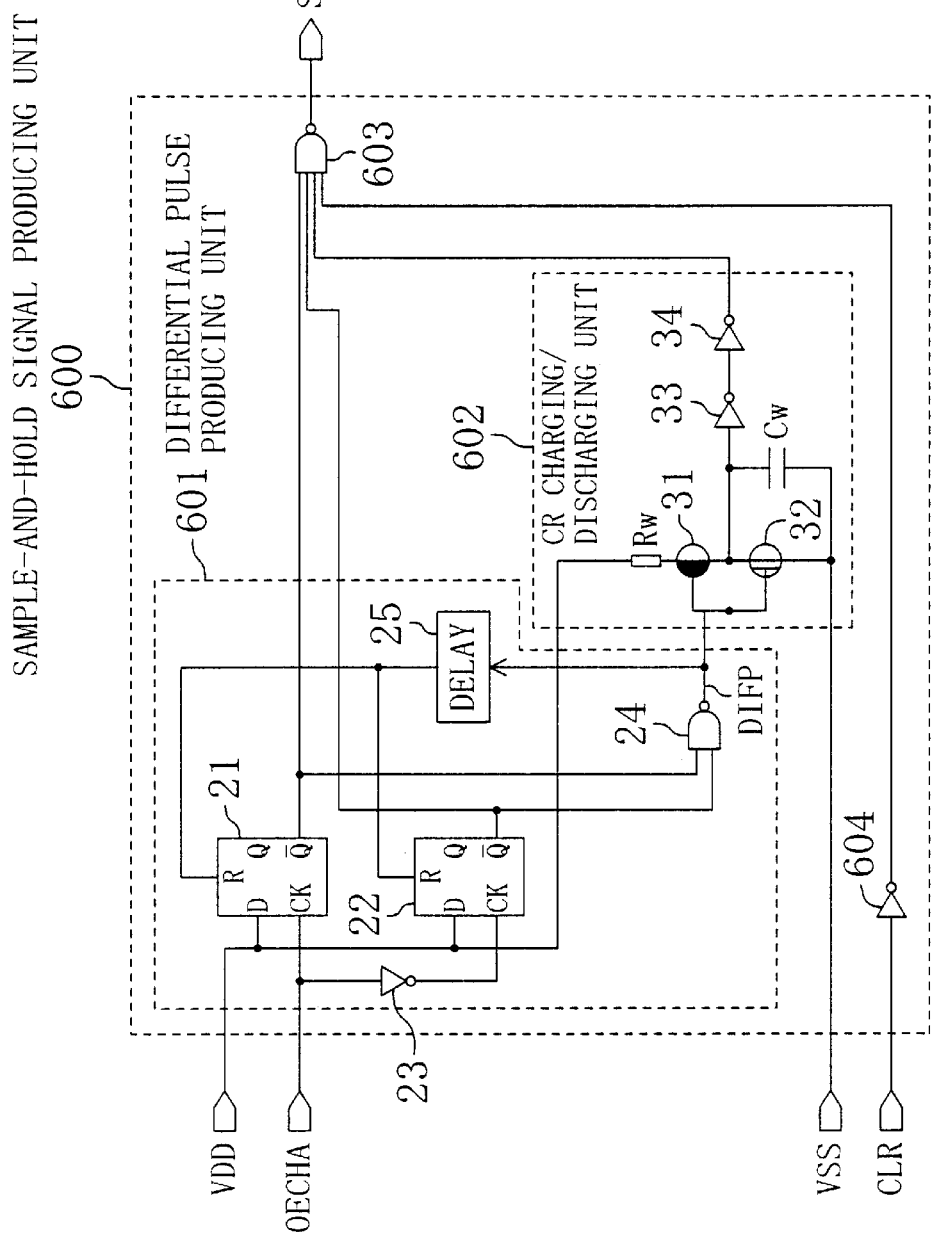
FIG. 12 is a diagram showing the circuit structure of a sample-and-hold signal producing unit.

FIG. 12 is a diagram showing the circuit structure of a sample-and-hold signal producing unit 600 for producing a sample-and-hold signal (SHON) to be applied to the sampleand-hold unit 250. The sample-and-hold signal producing unit 600 includes: a differential pulse producing unit 601 for receiving the odd/even detection signal (OECHA) and detecting both edges thereof so as to produce a differential pulse DIFP; a CR charging/discharging unit 602 triggered by the differential pulse DIFP to produce a pulse width of a sample-and-hold pulse; a logic gate (in FIG. 12, OR operation of negative logic by a NAND gate) 603 for receiving both edge detection pulses of the odd/even detection signal (OECHA) and the output pulse of the CR charging/discharging unit 602, and having its output terminal connected to an output terminal of the sample-and-hold signal producing unit 600; and an inverter 604 for inverting a clear signal input (CLR) for input to an input terminal of the logic gate 603.

The differential pulse producing unit 601 includes: a first D flip-flop 21 receiving the odd/even detection signal (OECHA) at its clock input terminal and having its D input terminal connected to a power supply terminal VDD; a second D flip-flop 22 receiving the odd/even detection signal (OECHA) at its clock input terminal through an inverter 23 and having its D input terminal connected to the power supply terminal VDD; a logic gate (NAND in FIG. 12) 24 receiving the respective inverted outputs (or non-inverted outputs) of the first and second D flip-flops 21, 22; and a delay unit 25 for applying the output of the logic gate 24 to the respective reset input terminals of the first and second D flip-flops 21, 22 with a delay. In both, D flip-flops 21, 22 of such a differential pulse producing unit 601, the inverted output terminal of the first D flip-flop 21 transitions from "Hi" to "Lo" at a rising edge of the odd/even detection signal (OECHA), and the inverted output terminal of the second D flip-flop 22 transitions from "Hi" to "Lo" at a falling edge thereof. Since each inverted output is applied to the reset input terminals through the logic gate 24 (in FIG. 12, OR operation of negative logic) and the delay unit 25. Therefore, the respective non-inverted outputs of the D flip-flops 21, 22 are restored to "Hi" after the delay time of the delay unit 25. In the differential pulse producing unit 601 operating as such, the output of the logic gate 24 is a differential pulse output D IFP, whose pulse width corresponds to the delay time of the delay unit 25.

The CR charging/discharging unit 602 includes: a resistive element Rw having its one end connected to the power supply terminal VDD and the other connected to a p-channel MOS transistor 31; a capacitive element Cw connected on one side to a ground terminal VSS and on the other side to the drain terminal of the p-channel MOS transistor 31 and the drain terminal of an n-channel MOS transistor 32 having a gate input in common with the p-channel MOS transistor 31; an inverter 33 having its input terminal connected to the common drain of the p-channel MOS transistor 31 and the n-channel MOS transistor 32; and an inverter 34 having its input terminal connected to the output of the inverter 33. In such a CR charging/discharging unit 602, when the differential pulse output DIFP of the differential pulse producing unit 601 (at "Hi" level in FIG. 12) is applied to the respective gate input terminals of the p-channel MOS transistor 31 and the n-channel MOS transistor 32, the n-channel MOS transistor 32 discharges the charges in the capacitive element Cw to the ground terminal VSS. Since the p-channel MOS transistor 31 is OFF, rapid discharge is possible. When the differential pulse disappears, the capacitive element Cw is charged from the power supply terminal VDD through the resistive element Rw and the p-channel MOS transistor 31. Since the n-channel MOS transistor 32 is OFF, the capacitive element Cw is charged with a time constant of approximately Cw·Rw. The terminal voltage of the capacitive element Cw thus charged/discharged is output through the inverters 33, 34, whereby a CR charging/discharging pulse is obtained. As described above, the CR charging/discharging unit 602 starts rapid discharge in response to the differential pulse input DIFP. Therefore, the CR charging/discharging pulse can be started at approximately the same timing as that of the differential pulse, and the pulse width thereof is determined by the charging time of the capacitive element Cw.

Then, both edge detection pulse outputs of the differential pulse producing unit 601 and CR charging/discharging pulse output of the CR charging/discharging unit 602 are applied as a sample-and-hold signal (SHON) to the output terminal of the sample-and-hold signal producing unit 600 through the logic gate 603 (in FIG. 12, OR operation of negative logic). In FIG. 12, a clear signal (CLR) is applied to the logic gate 603 through the inverter 604. The sample-and-hold signal producing unit 600 operating as such is capable of outputting a sample-and-hold signal (SHON) at both edges of the odd/even detection signal (OECHA). Note that the hold time of the sample-and-hold operation is set based on the charging time of the capacitive element Cw.

Figure 13:
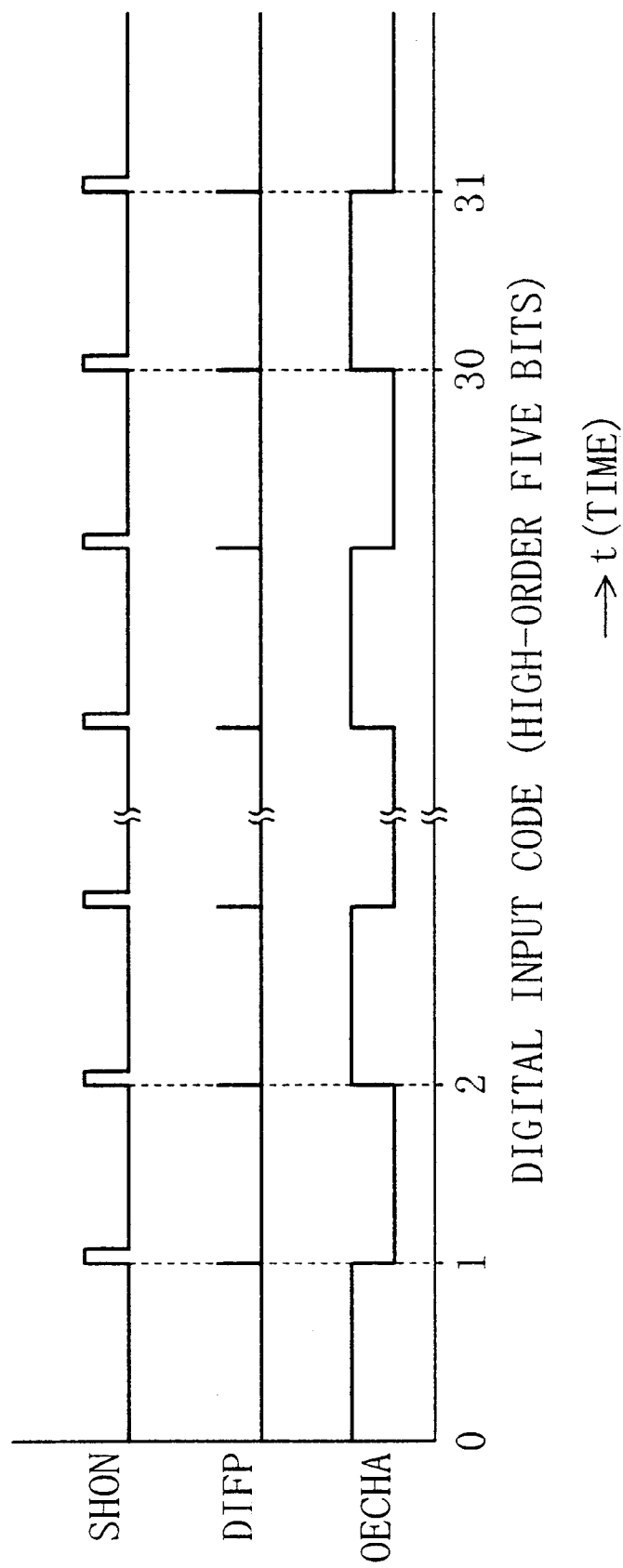
FIG. 13 is an operating waveform chart of a main part of the sample-and-hold signal producing unit of FIG. 12.

FIG. 13 is a main operating waveform chart of the sample-and-hold signal producing unit 600 in FIG. 12. As described above, the differential pulse producing unit 600 produces the differential pulse DIFP as shown in FIG. 13 both at the rising and falling edges of the input signal, i.e., the odd/even detection signal (OECHA). The CR charging/discharging unit 602 uses this differential pulse output as a discharge start pulse. The OR output of the differential pulse DIFP and the output pulse of the CR charging/discharging unit 602 having a pulse width corresponding to the CR charging period is the sample-and-hold signal (SHON).

Figure 14:
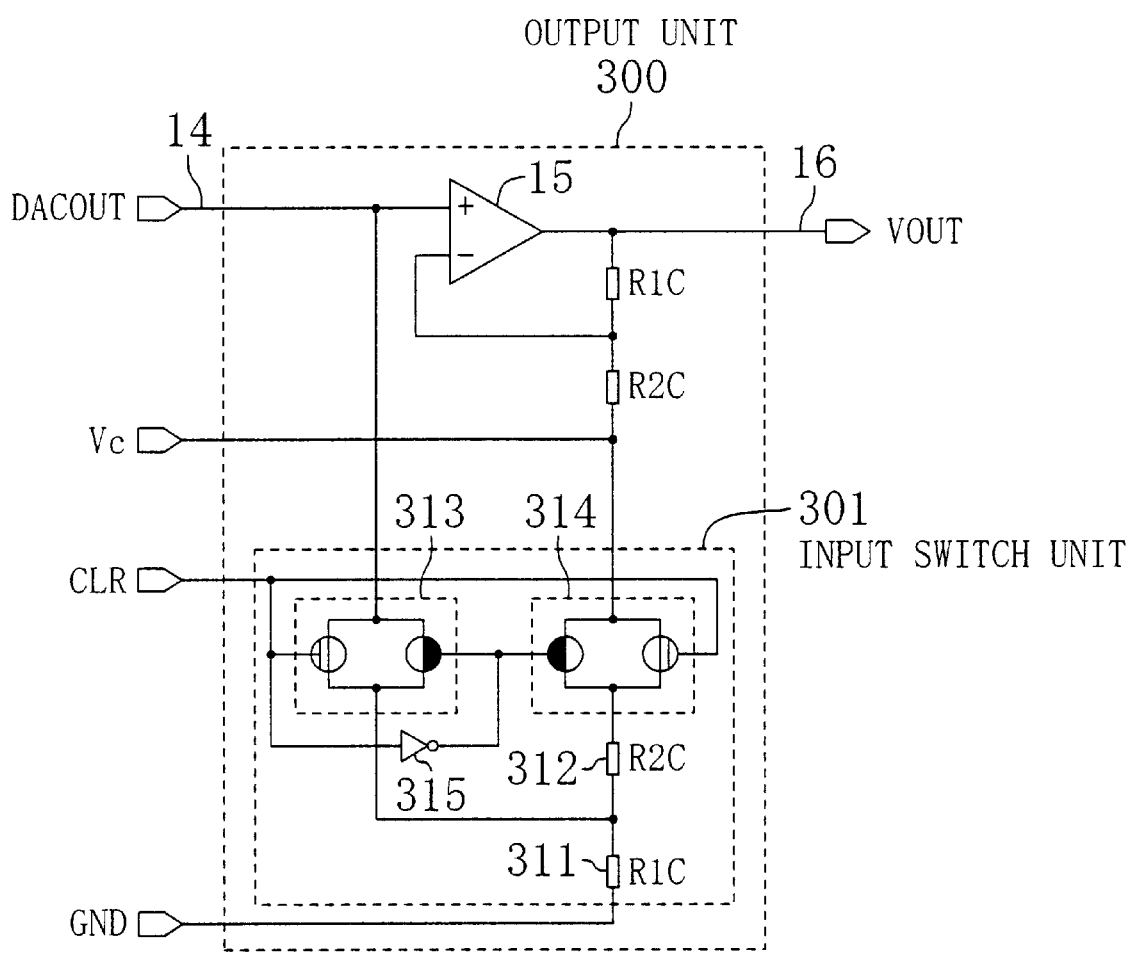
FIG. 14 is a diagram showing the circuit structure of an output unit of FIG. 1.

FIG. 14 is a diagram showing the circuit structure of the output unit 300. The output unit 300 includes an operational amplifier 15, first and second feedback resistances R1c, R2c, and an input switch unit 301. The input switch unit 301 includes resistive elements 311, 312 respectively having the same resistance value as that of the first and second feedback resistances R1c, R2c, MOS switches 313, 314 turned ON in response to a clear signal (CLR), and an inverter 315. The output terminal (DACOUT) 14 of the sample-and-hold unit 250 outputting an n-bit D-A conversion output as well as the output terminal of the MOS switch 313 in the input switch unit. 301 are connected to the noninverted input terminal of the operational amplifier 15 in the output unit 300. The connection node between the first and second feedback resistances R1c, R2c is connected to the inverted input terminal of the operational amplifier 15. The ther end of the second feedback resistance R2c is connected the input terminal of the MOS switch 314 in the input switch unit 301. The second feedback resistance R2c receives an arbitrary central voltage Vc at the other end. In the input switch unit 301, the MOS switch 314 receives the arbitrary central voltage Vc at its input terminal, and has its output terminal connected to one end of the resistive element 312 having the same resistance value as that of the second feedback resistance R2c. The other end of the resistive element 312 is connected to the other end of the resistive element 311 and the input terminal of the MOS switch 313. The resistive element 311 has the same resistance value as that of the first feedback resistance R1c and has its one end connected to the ground terminal (AND). When the clear signal (CLR) is not applied, the output unit 300 having such a structure multiplies the third output node voltage (DACOUT), i.e., the n-bit D-A conversion output, by the gain that is set by the feedback resistances R1c, R2c, with respect to the arbitrary central voltage Vc. Thus, the output unit 300 outputs the resultant voltage to the output terminal 16 as VOUT. When the clear signal (CLR="Hi") is applied, the sample-and-hold signal (SHON) rises to "Hi" level. Therefore, the voltage of the hold capacitance Cs (FIG. 11) is output to the output terminal of the sample-and-hold unit 250. At this time, the MOS switches 313, 314 of the input switch unit 301 are turned ON, whereby the voltage Vc divided by the resistive elements 311, 312 is applied to the input terminal of the operational amplifier 15. Since the feedback resistances R1c, R2c located on the inverted input side have the same resistance value as the resistive elements 311, 312, respectively, the ground potential is obtained at the output terminal 16 of the operational amplifier 15. In other words, the output unit 300 has the ability to output the ground potential to its output terminal (VOUT) 16 in response to the clear signal (CLR) regardless of the n-bit digital input code.

Figure 15:
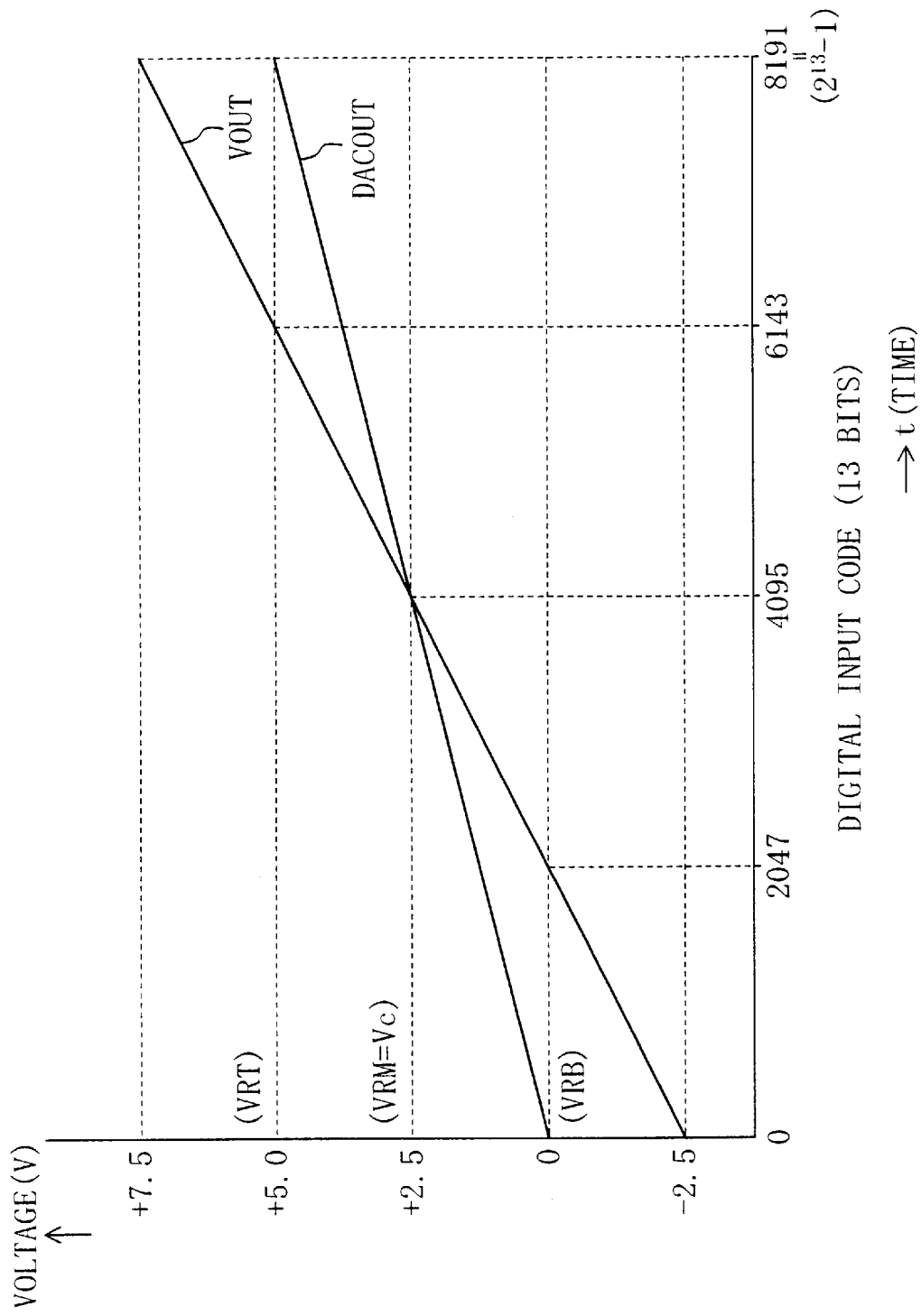
FIG. 15 is an operating waveform chart of a main part of the output unit of FIG. 14.

FIG. 15 shows a main operating waveform chart of the output unit 300 in FIG. 14. In FIG. 15, it is assumed that the feedback resistances R1c, R2c have the same resistance (R1c=R2c). Accordingly, the gain of the operational amplifier 15 in the output unit 300 is doubled. The applied arbitrary central voltage Vc is set to {VRB+(VRT−VRB)/2}, which is equal to the median voltage (VRM) of the resistance string unit 101. FIG. 15 shows a change in DACOUT and VOUT when the applied 13-bit digital input code changes (increments) from 0 to 8,191 (=$2^{13}$−1) in decimal notation under the aforementioned conditions. For example, provided that VRT=5.0 V, VRB=0 V, and Vc=VRM=2.5 V, a voltage in the range of −2.5 V to +7.5 V is output to the total D-A conversion output terminal VOUT with a resolution of 10.0 V/$2^{13}$ as the 13-bit digital input code changes from 0 to 8,191 in decimal notation.

Figure 16:
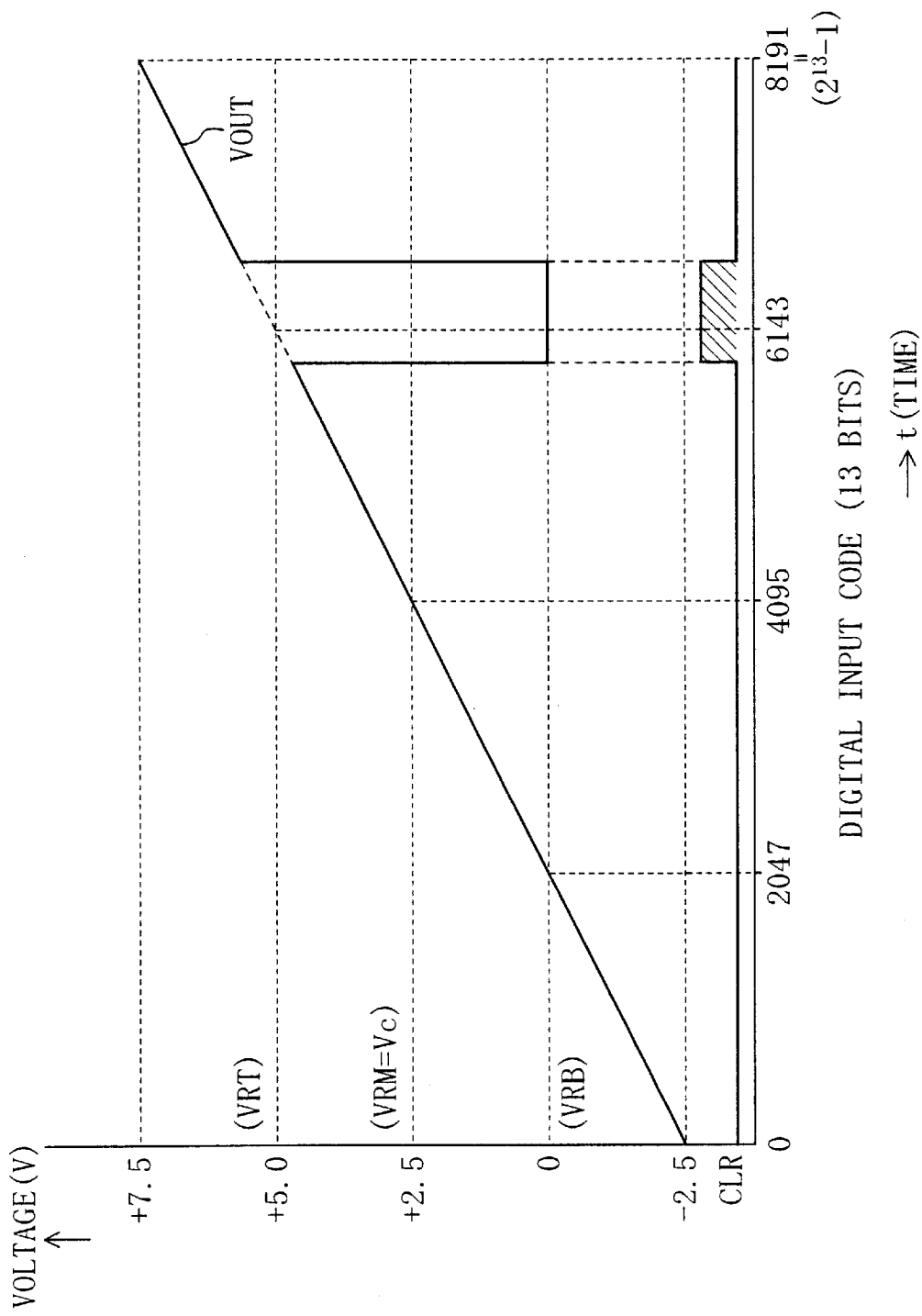
FIG. 16 is a diagram showing an output waveform when a clear signal is applied to the output unit of FIG. 14.

FIG. 16 shows an output waveform of VOUT when the clear signal (CLR) is applied to the output unit 300 at an arbitrary timing. In response to the clear signal (CLR), the MOS switches 313, 314 of the input switch unit 301 in the output unit 300 are turned ON as described above, whereby a voltage of 0 V is output as VOUT as shown in FIG. 16. However, if the clear signal CLR is removed, the D-A conversion voltage value of the digital input code is again output as VOUT.

Figure 17A:
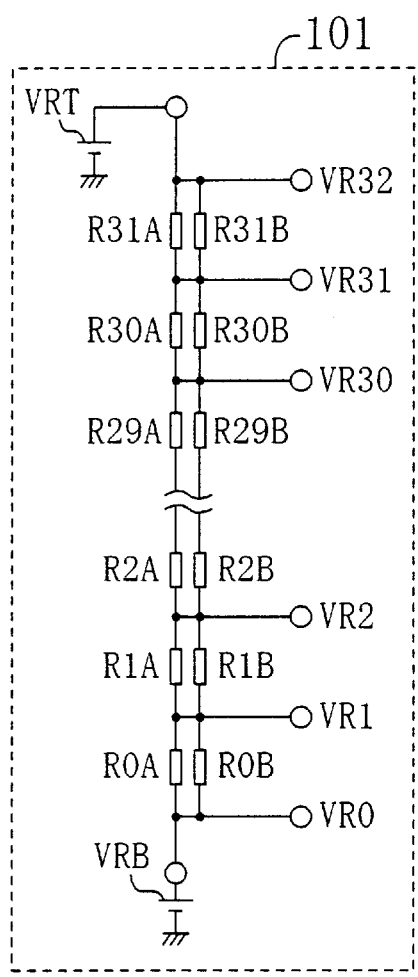
FIGS. 17A and 17B are diagrams illustrating the layout of string resistances in the high-order D-A converter circuit unit of FIG. 1.
Figure 17B:
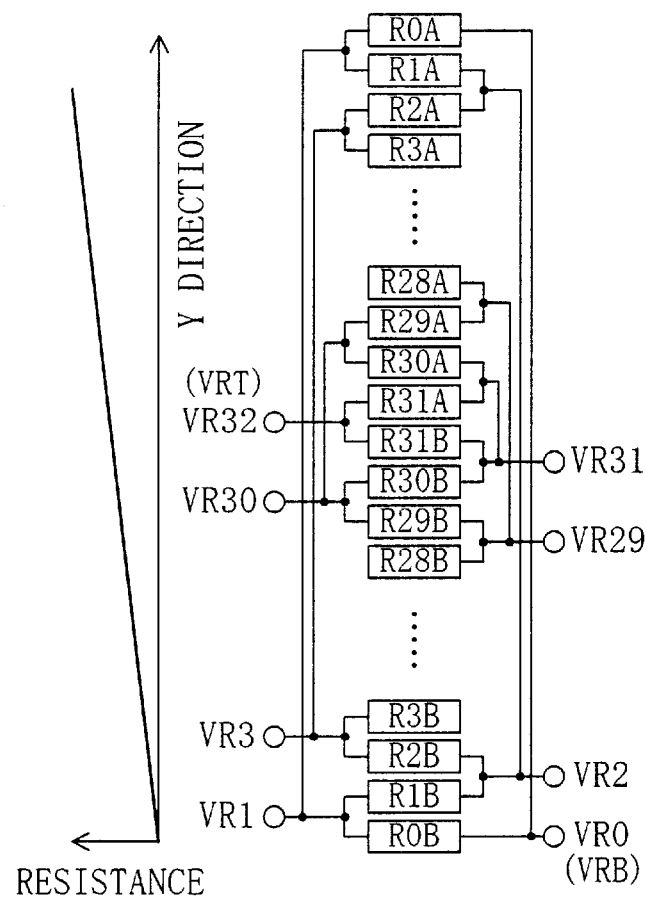

FIGS. 17A and 17B are diagrams illustrating the layout of the resistance string unit 101 of the high-order D-A converter circuit unit 100. Each string resistance R0 to R31 in the resistance string unit 101 is formed from two resistances R0A, R0B to R31A, R31B having the same resistance value. These resistances are sequentially arranged one-byone outward from R31A, R31B connected to the VRT input terminal to R0A, R0B connected to the VRB input terminal. The resistance string unit 101 having such layout is capable of avoiding variation in divided voltage value of each connection node, because each parallel resistance value is corrected in terms of variation in resistance in the Y direction as shown in FIG. 17B. Accordingly, the accuracy in each resistance divided voltage serving as a reference voltage (low-order reference voltage) of the low-order D-A converter circuit unit 200 can be improved, contributing to an accurate D-A conversion output. Note that the same effects can be obtained even when the string resistance arrangement is inverted in terms of VRT and VRB.

Figure 18:
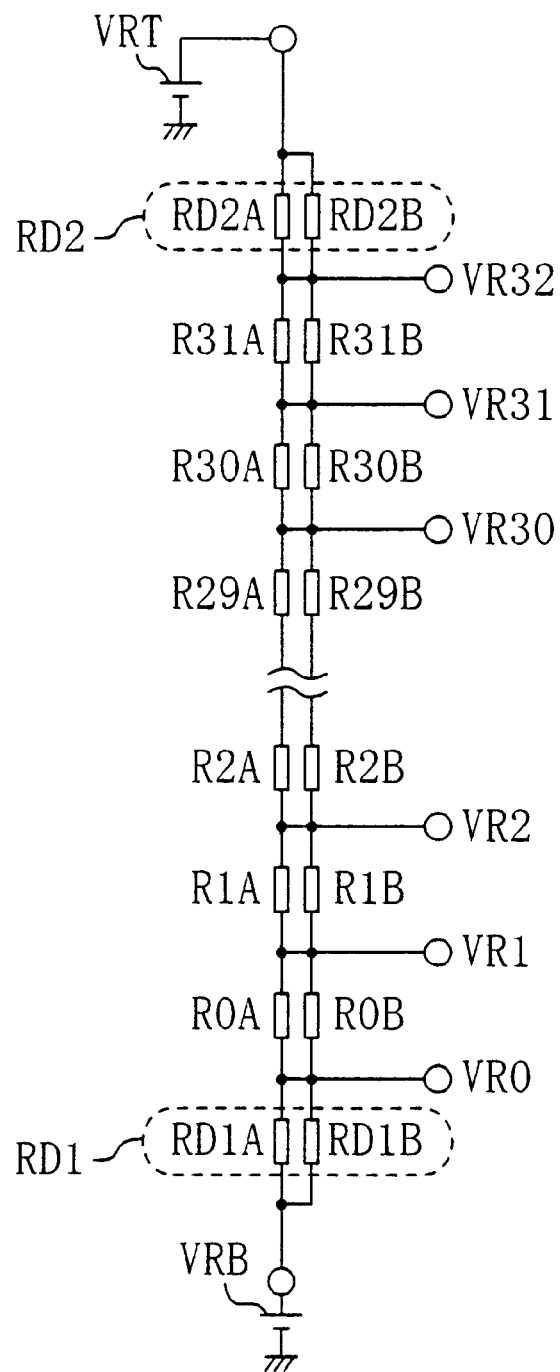
FIG. 18 is a diagram showing the circuit structure of a resistance string unit having dummy resistances provided at both ends of the string resistances of FIG. 1.

FIG. 18 is a diagram showing the resistance string unit 101 having dummy resistances RD1, RD2 respectively inserted between the terminals receiving the first and second reference voltages (VRT, VRB) and the resistances at both ends of the resistance string unit 101. More specifically, the dummy resistances RD1A, RD1B; RD2A, RD2B are respectively inserted in parallel between the terminals receiving the first and second reference voltages (VRT, VRB) and the resistances for causing a voltage on the corresponding connection point to be transmitted to the respective first MOS switch in the selection circuit 102 from the terminals receiving the first and second reference voltages (VRT, VRB). By adding RD1 and RD2, the resistance-divided voltages (VR0 to VR32) in FIG. 18 are each shifted from the value before adding them. However, the same final D-A conversion output (VOUT) as that before adding the dummy resistances can be easily obtained by setting the resistance values of the feedback resistances R1c, R2c in the output unit 300. For example, in the case where the voltage is divided by $2^5$=32, the number of resistance-divided voltages is increased from 32 to 34 due to the dummy resistances inserted at both ends. In this case, the gain of the operational amplifier 10 in the output unit 300 need only be multiplied by (34/32), as described above. By adding the dummy resistances RD1, RD2, the difference between the resistance-divided voltages is equalized even if there is any wiring resistance between the first and second reference voltages VRT, VRB and the dummy resistances RD2, RD1. Therefore, the low-order reference voltages and each divided voltage including VRT, VRB have the same voltage difference as that of the other divided voltages. As a result, an accurate D-A conversion output can be obtained at VOUT.

Figure 19:
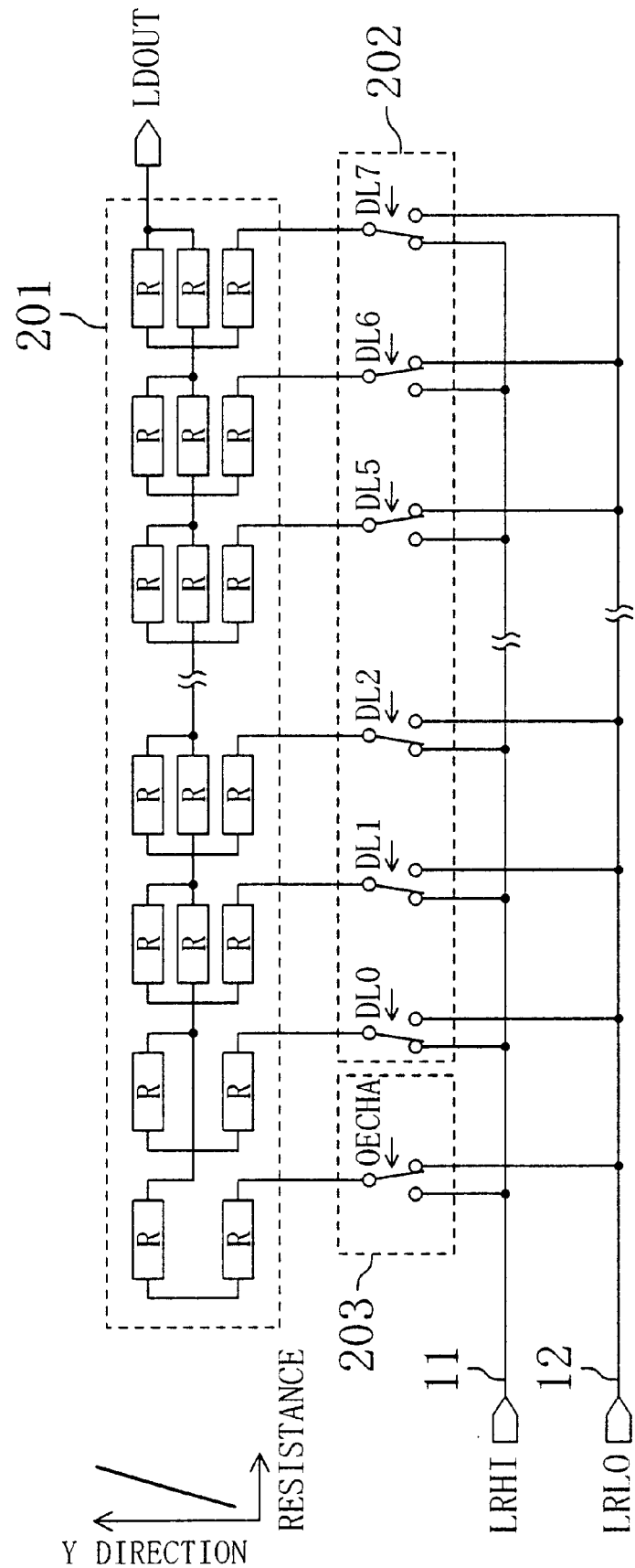
FIG. 19 is a diagram showing the layout of an R–2R ladder resistance unit in the low-order D-A converter circuit unit of FIG. 1.

FIG. 19 is a diagram showing the layout of the R–2R ladder resistance unit 201. The ladder resistances in the R–2R resistance unit 201 are arranged such that two resistances R are connected in series in each 2R portion and disposed on both sides of the resistance of the corresponding R portion. The ladder resistances with such layout can prevent the resistance ratio between the R and 2R portions in each input bit stage from varying from 1:2, because each serial resistance value of the 2R portions is corrected in terms of variation in resistance in the Y direction. Accordingly, the conversion accuracy of the low-order D-A conversion output (LDOUT) can be improved, contributing to an accurate D-A conversion output.

Figure 20:
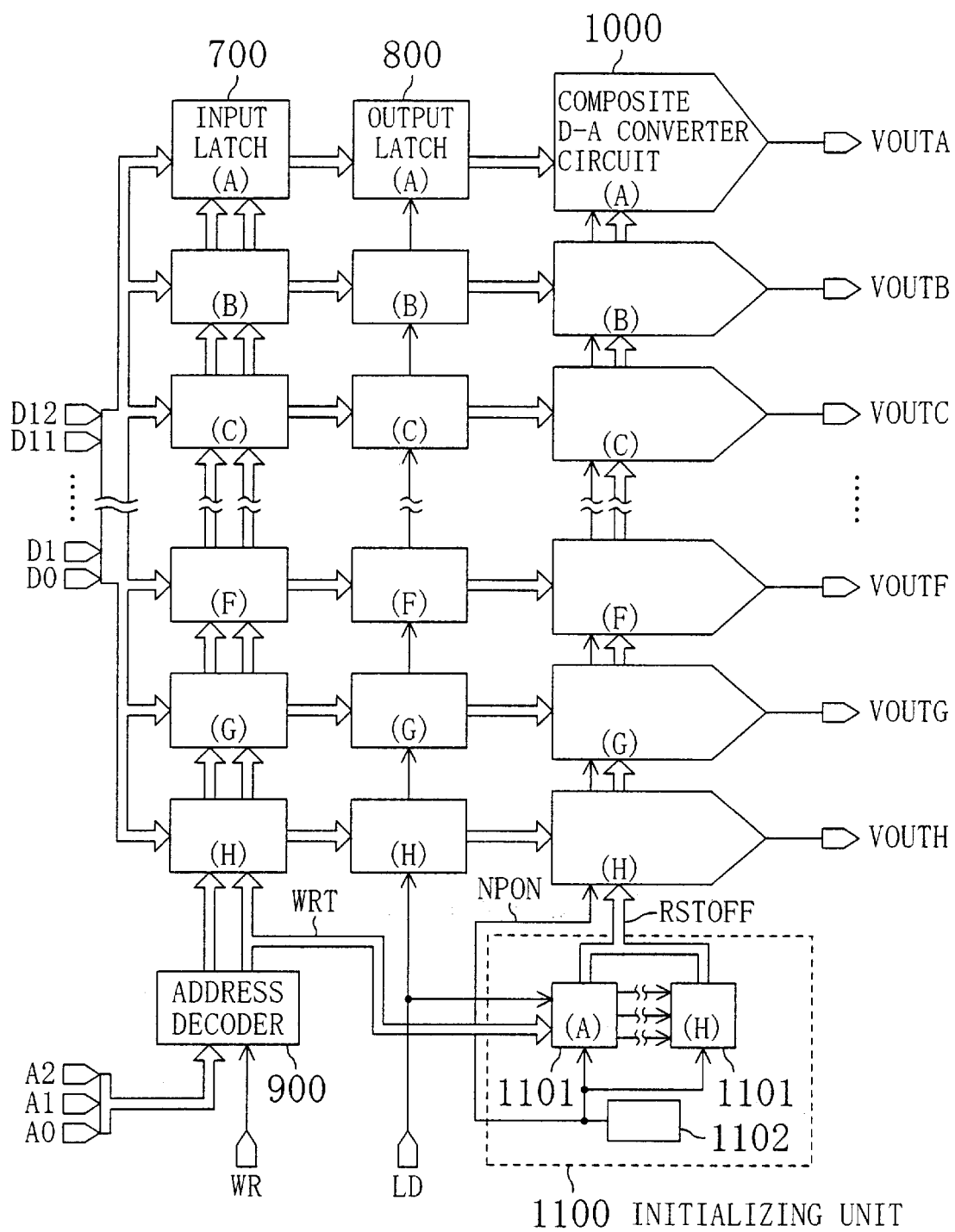
FIG. 20 is a block diagram showing the basic structure of a D-A converter including a plurality of composite D-A converter circuits of FIG. 1.

FIG. 20 is a block diagram showing the basic structure of a D-A converter including a plurality (eight in this example) of composite D-A converter circuits 1000 described above according to the present invention. In addition to the composite D-A converter circuits 1000, the D-A converter of FIG. 20 includes a plurality of input latches 700 as first latches, a plurality of output latches 800 as second latches, an address decoder 900 for selecting one of the eight composite D-A converter circuits 1000, and an initializing unit 1100 for conducting a prescribed operation in response to power-ON. The decode output of the address decoder 900 is supplied together with a latch signal (WRT based on WR) to the plurality of input latches 700, and a 13-bit digital input code (D12 to D0) is latched in the input latch 700 selected based on the value of address bit inputs A0 to A2.

The output latch 800 receiving the output of the selected input latch 700 latches the same code as the 13-bit digital input code according to a latch signal (LD) applied after the 13-bit digital input code is latched in the selected input latch 700. The latch signal (LD) is supplied to every output latch 800 so as to simultaneously latch the plurality of output latches 800 in common. The composite D-A converter circuit 1000 outputs the D-A conversion output to one of the output terminals of the D-A converter according to the output of the output latch 800 (in this example, the 13-bit digital code). In the D-A converter operating as such, the initializing unit 1100 includes a plurality of initial reset cancel signal producing units 1101, and a single powerON ON detecting unit 1102. The initializing unit 1100 receives the respective latch signals (WRT) of the plurality of input latches 700 and the common latch signal (LD) of the output latches 800, and outputs a power-ON signal (NPON) and a reset cancel signal (RSTOFF) to the respective sample-and-hold signal producing units 600 of the plurality of composite D-A converter circuits 1000. When the system is powered ON, the plurality of composite D-A converter circuits 1000 simultaneously output "0 V" to every output terminal (VOUTA to VOUTH). As an arbitrary 13-bit digital input code is sequentially latched in the input latches 700 and then in the output latches 800, a (D-A converted) analog voltage corresponding to the digital input code is sequentially output to each output terminal (VOUTA to VOUTH).

Figure 21:
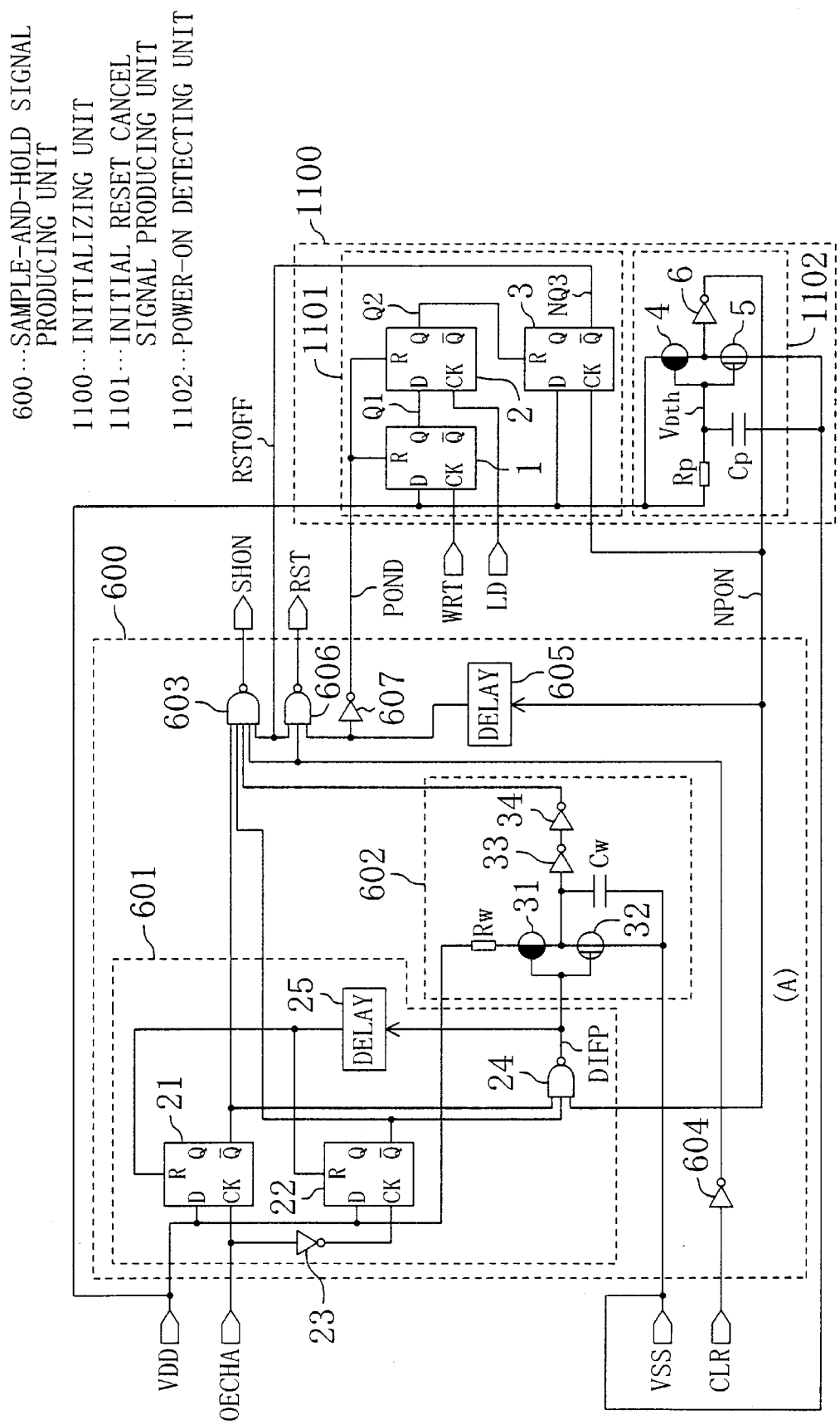
FIG. 21 is a diagram showing the circuit structure of an initializing unit of FIG. 20.

FIG. 21 is a diagram showing the circuit structure of the initializing unit 1100 and the sample-and-hold signal producing unit 600 (FIG. 12) with a delay unit 605, a logic gate 606 and an inverter 607 added thereto. In the initializing unit 1100, the initial reset cancel signal producing unit 1101 includes: a first D flip-flop 1 receiving the latch signal (WRT) of the input latch 700 at its clock input terminal; a second D flip-flop 2 receiving the latch signal (LD) of the output latch 800 at its clock input terminal; and a third D flip-flop 3 receiving the output signal (NPON) from the power-ON detecting unit 1102 at its clock input terminal. The respective input terminals of the first and third D flip-flops 1, 3 are connected to the power supply terminal VDD. The output signal (NPON) of the power-ON detecting unit 1102 is applied to the respective reset input terminals of the first and second D flip-flops 1, 2 with a delay (POND). The Q output terminal of the first D flip-flop 1 is connected to the D input terminal of the second D flip-flop 2. The power-ON detecting unit 1102 has a power-ON detecting resistive element Rp and a capacitance Cp that are connected in series from the power supply VDD to be detected toward the ground terminal VSS. A voltage ($V_{Dth}$) at the connection between the power-ON detecting resistive element Rp and the capacitance Cp is output as a negative power-ON detection signal (NPON), i.e., a power-ON detection output, through a CMOS gate and an inverter 6. The CMOS gate has its threshold voltage adjusted by setting the respective channel widths W of a p-channel MOS transistor 4 and an n-channel MOS transistor 5.

Figure 22:
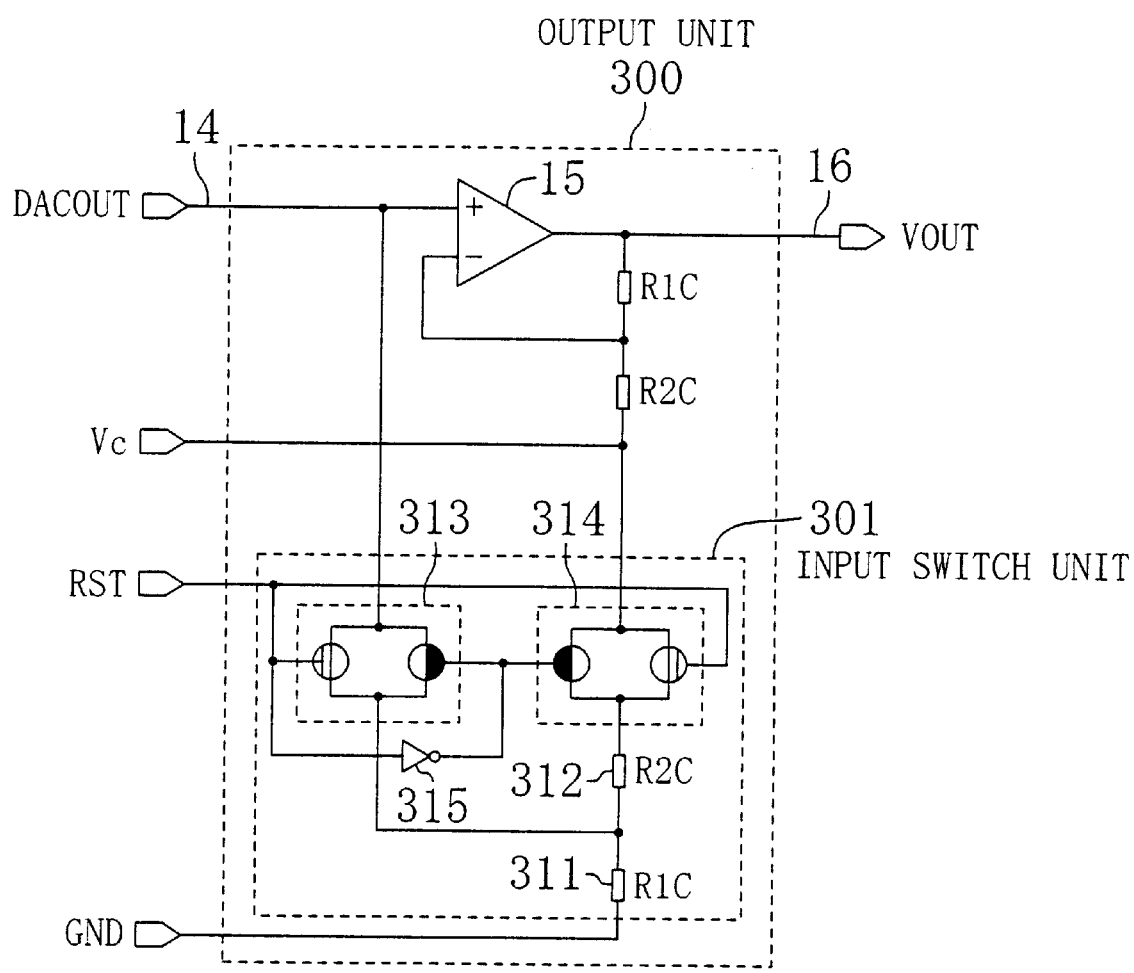
FIG. 22 is a diagram showing the circuit structure of an output unit in the composite D-A converter circuit of FIG. 20.

FIG. 22 is a diagram showing the same circuit as that of the output unit 300 of FIG. 14 except that the clear (CLR) input is replaced with a reset (RST) input. Each composite D-A converter circuit 1000 in FIG. 20 includes the output unit 300 of FIG. 22.

Figure 23:
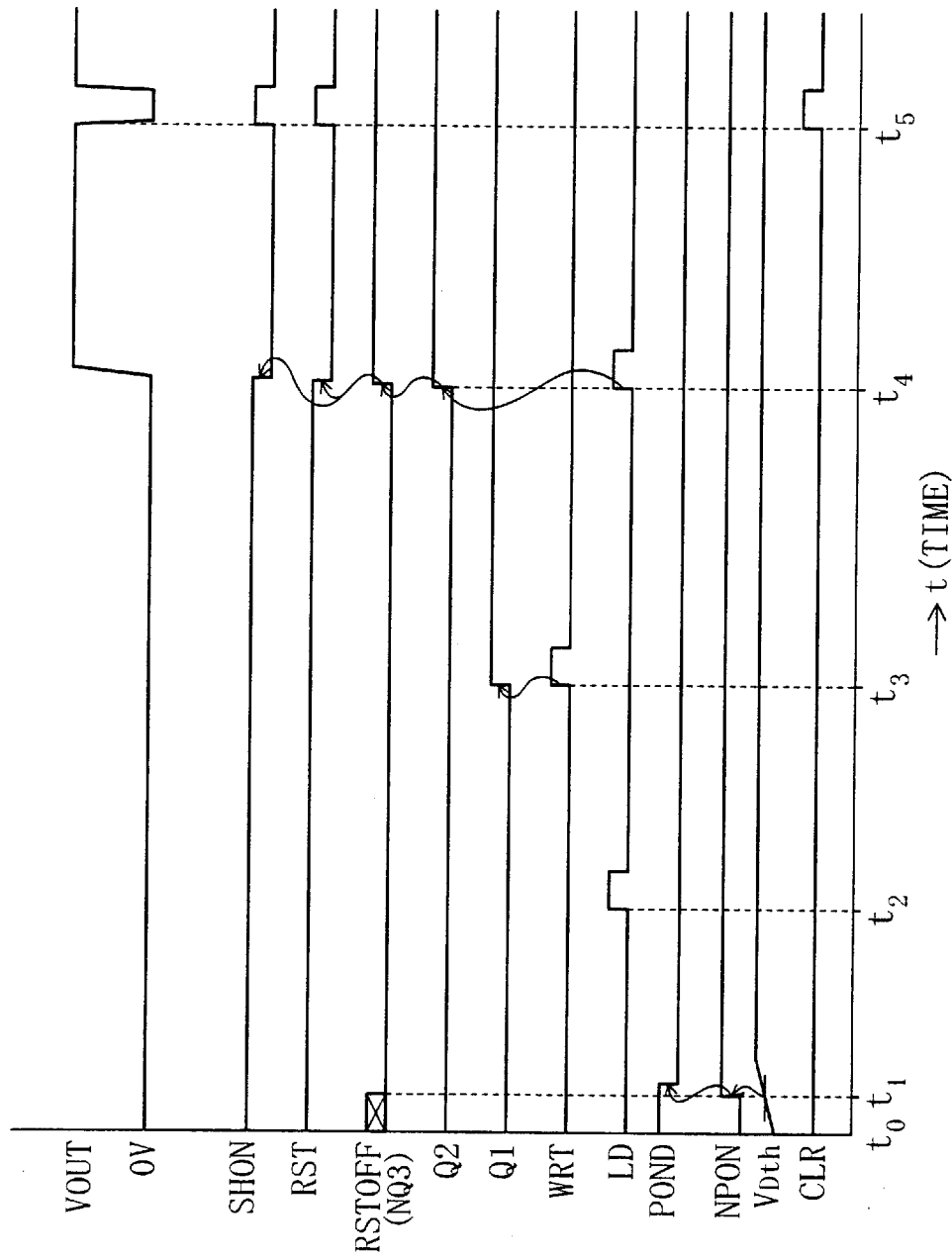
FIG. 23 is an operating waveform chart of a main part in FIGS. 20 to 22.

The operation of the initializing unit 1100 including the initial reset cancel signal producing units 1101 and the power-ON detecting unit 1102 structured as such will now be 5 described with reference to the main operating waveform chart of FIG. 23. When the system is powered ON at time t0, the voltage $V_{Dth}$ at the connection between the resistance Rp and the capacitance Cp in the power-ON detecting unit 1102 starts to be charged toward the power supply voltage VDD. At time t1 when the voltage $V_{Dth}$ exceeds the threshold voltage of the CMOS gate in the following stage (an inverter formed from the p-channel MOS transistor 4 and the n-channel MOS transistor 5), the output of the CMOS gate (inverter) transitions from "Hi" level to "Lo" level. The output of the CMOS gate is transmitted to the output terminal of the power-ON detecting unit 1102 through the inverter 6, and is output as the output signal NPON at "Lo" level from time t0 to t1. The power-ON detection signal (NPON) is then applied (POND) to the respective reset input terminals of the first and second D flip-flops 1, 2 in the initial reset cancel signal producing unit 1101 through the delay unit 605 and the inverter 607 in the sample-and-hold signal producing unit 600. Therefore, the Q output (Q2) of the second D flip-flop 2 continues to output "Lo" over the "Lo" period of the signal NPON, so that the third D flip-flop 3 receiving the signal NPON at its clock input will not be reset. Accordingly, the inverted Q output (NQ3) of the third D flip-flop 3 outputs "Lo" (RSTOFF) at a rising edge of the signal NPON. This signal (RSTOFF) is then output from the sample-and-hold signal producing unit 600 as a reset signal (RST) through the logic gate 606 added to the sample-and-hold signal producing unit 600. Due to the signal (RSTOFF), the sample-and-hold signal (SHON) rises to "Hi" level together with the reset signal (RST). When the reset signal (RST) is at "Hi" level, a voltage of 0 V is output to the D-A conversion voltage output terminal (VOUT) of the output unit 300. This voltage of 0 V is continuously output until the reset signal (RST) falls to "Lo" level (until initial reset is cancelled).

At time t2, the latch signal (LD) of the output latch 800 is applied to the clock input of the second D flip-flop 2. However, since the latch signal (WRT) of the input latch 700 has not arrived at the clock input terminal of the first D flip-flop 1, the second D flip-flop 2 continues to output "Lo" from the Q output (Q2). Accordingly, at time t2, the third D flip-flop 3 also continues to output "Lo" from the inverted Q output (RSTOFF), and the sample-and-hold signal (SHON) and the reset signal (RST) are retained at "Hi" level. Therefore, the voltage of 0 V continues to be output from the D-A conversion output terminal VOUT.

At time t3, the incoming latch signal (WRT) of the input atch 700 is applied to the clock input terminal of the first flip-flop 1, so that the Q output (Q1) of the first D flip-flop 1 transitions from "Lo" to "Hi". However, no more change occurs at time t3.

At time t4, the latch signal (LD) of the output latch 800 is again applied, so that the second D flip-flop 2 introduces therein the level ("Hi") at the Q output (Q1) of the first D flip-flop 1 and outputs it to the Q output terminal of the second D flip-flop 2. Therefore, the third D flip-flop 3 is reset, and the initial reset cancel signal (RSTOFF) at the inverted Q output of the third D flip-flop 3 transitions from "Lo" level to "Hi" level. Thus, the initial reset state is cancelled. In other words, the sample-and-hold signal (SHON) and the reset signal (RST) that are retained at "Hi" level from the power-ON at time t0 fall to "Li" level at time t4 for the first time. Thus, an analog voltage resulting from D-A conversion of the 13-bit digital input code latched in the input latch 700 is output to the DA conversion output terminal (VOUT). More specifically, when the latch signal (LD) of the output latch 800 is applied after application of the latch signal (WRT) of the input latch 700, the composite D-A converter circuit 1000 outputs the D-A conversion output to VOUT instead of the initial output of 0 V. However, even when the latch signal (LD) of the output latch 800 is applied without application of the latch signal (WRT) of the input latch 700, the composite D-A converter circuit 1000 continues to output the initial output of 0 V. This means that each of the plurality of composite D-A converter circuits 1000 in the D-A converter continues to output the initial output of 0 V even when the 13-bit digital input code is latched in the input latch 700 of another composite D-A converter circuit after application of the power and then transferred and latched in the output latch 800 thereof, but each composite D-A converter circuit 1000 outputs the D-A conversion output of the 13-bit digital input code latched in its corresponding input latch 700 when the 13-bit digital input code is latched in its corresponding input latch 700 and then is transferred and latched in its corresponding output latch 800.

At time t5, the clear input (CLR) is applied, whereby the sample-and-hold signal (SHON) and the reset signal (RST) both rise to "Hi" level, and the composite D-A converter circuit 1000 outputs a voltage of 0 V. As soon as the clear signal (CLR) disappears, the composite D-A converter circuit 1000 again outputs the same D-A conversion voltage as that is output right before the clear signal (CLR) is applied.

As has been described above, the D-A converter of the present invention provides a multi-bit input (13 bits in this example), multi-channel (which means that a plurality of D-A converter circuits are incorporated), high-precision D-A converter.

Industrial Applicability

According to the present invention, even when a large number of bits are converted, a desired analog voltage can be obtained with high accuracy without requiring relative accuracy of the resistive elements used therein and device accuracy such as ON-resistance value of the MOS switches, nor increasing the number of wirings, the number of MOS switches, the MOS switch size and the like. Moreover, a plurality of D-A converter circuits can be integrated simultaneously.

What is claimed is:

1. A digital-analog converter circuit, characterized in that comprises:
    a high-order D-A converter circuit unit for receiving a high-order i bit signal (i<n) of an n-bit digital input code, and outputting first and second voltages resulting from D-A conversion of the high-order i bit signal to first and second output nodes through first and second buffers, respectively;
    a low-order D-A converter circuit unit for receiving the first and second output node voltages of the high-order D-A converter circuit unit as reference voltages of an R–2R ladder circuit, and conducting D-A conversion of remaining low-order j bits<n, j=n−i) of the n-bit digital input code for output to a third output node;
    a sample-and-hold unit for selectively sampling and holding the voltage on the third output node, i.e., the D-A conversion output of the n-bit digital input code, according to a value of the n-bit digital input code; and
    an output unit for multiplying the sampled and held D-A conversion output voltage by a gain with respect to an arbitrary central voltage.

2. The digital-analog converter circuit according to claim 1, characterized in that the high-order D-A converter circuit unit includes:
    a resistance string unit having $2^i$ resistive elements connected in series between first and second reference voltages applied thereto, the $2^i$ resistive elements having the same resistance value,
    a selection circuit unit for simultaneously and selectively taking out adjacent voltages on connection nodes between the resistive elements, and
    a means for preventing a plurality of non-adjacent connection nodes from being simultaneously selected from the connection nodes of the resistance string unit.

3. The digital-analog converter circuit according to claim 1, characterized in that the high-order D-A converter circuit unit includes:
    a resistance string unit having $2^i$ resistive elements connected in series between first and second reference voltages applied thereto, the $2^i$ resistive elements having the same resistance value,
    a selection circuit unit for simultaneously and selectively taking out adjacent voltages on connection nodes between the resistive elements, and
    a means for switching a substrate voltage of an n-channel MOS transistor and a p-channel MOS transistor of each MOS switch in the selection circuit unit according to an MSB code of the n-bit digital input code.

4. The digital-analog converter circuit according to claim 1, characterized in that the high-order D-A converter circuit unit includes:
    a resistance string unit having $2^i$ resistive elements connected in series between first and second reference voltages applied thereto, the $2^i$ resistive elements having the same resistance value,
    a selection circuit unit for simultaneously and selectively taking out adjacent voltages on connection nodes between the resistive elements, and
    a means for producing an odd/even detection signal from the high-order i bits of the n-bit digital input code, the odd/even detection signal indicating whether a selected one of voltage segments divided in the resistive string unit is an even voltage segment or an odd voltage segment from the first or second reference voltage,
    the low-order D-A converter circuit unit includes
        first MOS switch means each having the same structure, for short-circuiting a terminal of a corresponding 2R in the R–2R to the two reference voltages output from the first and second buffers, according to a value of the low-order j bits of the n-bit digital input code, the terminal being a terminal located on a side other than an R side, and
        second MOS switch means each having the same structure, for setting one of the two reference voltages as a lower-potential reference voltage and the other as a higher-potential reference voltage according to the odd/even detection signal, and the low-order D-A converter circuit unit has pairs of MOS switches as MOS resistances inserted in series in an ON state on the R side of the R–2R such that the MOS switches of each pair are connected in parallel with each other, the MOS switches having the same structure as that of the first and second switch means.

5. The digital-analog converter circuit according to claim 4, characterized in that it further comprises a means for switching a substrate voltage supplied to an n-channel MOS transistor and a p-channel MOS transistor of each of the first and second switch means and the MOS resistances to the two reference voltages according to the odd/even detection signal.

6. The digital-analog converter circuit according to claim 1, characterized in that the high-order D-A converter circuit unit includes:

a resistance string unit having $2^i$ resistive elements connected in series between first and second reference voltages applied thereto, the $2^i$ resistive elements having the same resistance value, a selection circuit unit for simultaneously and selectively taking out adjacent voltages on connection nodes between the resistive elements, and a means for producing an odd/even detection signal from the high-order i bits of the n-bit digital input code, the odd/even detection signal indicating whether a selected one of voltage segments divided in the resistive string unit is an even voltage segment or an odd voltage segment from the first or second reference voltage, and the digital-analog converter circuit further comprises a sample-and-hold signal producing unit for producing at both edges of the odd/even detection signal a pulse having a prescribed width, and supplying the pulse to the sample-and-hold unit.

7. The digital-analog converter circuit according to claim 6, characterized in that the sample-and-hold signal producing unit includes:

a differential pulse producing unit for detecting both edges of the odd/even detection signal and producing a differential pulse at the both edges, a capacitance for discharging charges through an n-channel MOS transistor receiving both of the differential pulses at its gate input, and a resistance inserted in a path for charging, after the differential pulse disappears, the capacitance through a p-channel MOS transistor receiving both of the differential pulses at its gate input, and an OR output of each differential pulse and a charging/discharging pulse of the capacitance and the resistance is a sample-and-hold signal.

8. The digital-analog converter circuit according to claim 1, characterized in that the output unit includes a switch means, wherein when a clear signal is applied as a control input and the sample-and-hold unit holds the voltage on the third node, a voltage multiplied by a gain with respect to an arbitrary central voltage is applied to a feedback input terminal of an operational amplifier, and a voltage having the same voltage difference from the central voltage with respect to a ground potential as that of the voltage applied to the feedback input terminal is applied from the switch means to an input terminal of the operational amplifier.

9. The digital-analog converter circuit according to claim 1, characterized in that the high-order D-A converter circuit unit includes:

a resistance string unit having $2^i$ resistive elements connected in series between first and second reference voltages applied thereto, the $2^i$ resistive elements having the same resistance value, and a selection circuit unit for simultaneously and selectively taking out adjacent voltages on connection nodes between the resistive elements, and the resistances in the resistance string unit of the high-order D-A converter circuit unit are connected in pairs such that the resistances of each pair are connected in parallel, and the resistances are sequentially arranged one-by-one outward from the string resistances receiving the first or second reference voltage to the string resistances receiving the second or first reference voltage.

10. The digital-analog converter circuit according to claim 1, characterized in that the high-order D-A converter circuit unit includes:

a resistance string unit having $2^i$ resistive elements 5 connected in series between first and second reference voltages applied thereto, the $2^i$ resistive elements having the same resistance value, and a selection circuit unit for simultaneously and selectively taking out adjacent voltages on connection nodes between the resistive elements, and dummy resistances are respectively inserted between terminals respectively receiving the first and second reference voltages and the resistances at both ends of the resistance string unit, i.e., the resistances for causing a voltage on a corresponding connection point to be transmitted to a respective first MOS switch in the selection circuit from the terminals receiving the first and second reference voltages.

11. The digital-analog converter circuit according to claim 1, characterized in that n, i and j are 13, 5 and 8, respectively.

12. A multi-channel D-A converter including a plurality of digital-analog converter circuits according to any one of claims 1, 2, 3, and 4 to 10, characterized in that it comprises:

a plurality of identical first latches;

a plurality of identical second latches;

an address decoder; and an initializing unit including a power-ON detecting unit and an initial reset cancel signal producing unit, the initial reset cancel signal producing unit includes a first D flip-flop receiving a signal for latching the first latch at its clock input terminal, a second D flip-flop receiving a signal for latching the second latch at its clock input terminal, and a third D flip-flop receiving an output of the power-ON detecting unit at its clock input terminal, and respective input terminals of the first and third D flip-flops are connected to a power supply terminal, the output of the power-ON detecting unit is applied with a delay to respective reset input terminals of the first and second flip-flops, a Q output terminal of the first D flip-flop is connected to a D input terminal of the second D flip-flop, and a Q output terminal of the second D flip-flop is connected to a reset input terminal of the third D flip-flop.

* * * * *

UNITED STATES PATENT AND TRADEMARK OFFICE
CERTIFICATE OF CORRECTION

PATENT NO.     : 6,469,647 B1
DATED          : October 22, 2002
INVENTOR(S)    : Norihide Kinugasa et al.

It is certified that error appears in the above-identified patent and that said Letters Patent is hereby corrected as shown below:

<u>Title page,</u>
Item [56], References Cited, add -- JP 61-26330 A --
Delete "JP 5-347562" add -- JP 5-347652 --

Signed and Sealed this

Eighteenth Day of March, 2003

JAMES E. ROGAN
*Director of the United States Patent and Trademark Office*